(12) United States Patent
Lindfors et al.

(10) Patent No.: US 8,211,235 B2
(45) Date of Patent: Jul. 3, 2012

(54) APPARATUSES AND METHODS FOR DEPOSITION OF MATERIAL ON SURFACES

(75) Inventors: Sven Lindfors, Espoo (FI); Juha Allan Kustaa-Adolf Poutiainen, Helsinki (FI)

(73) Assignee: Picosun Oy, Espoo (FI)

( * ) Notice: Subject to any disclaimer, the term of this patent is extended or adjusted under 35 U.S.C. 154(b) by 1225 days.

(21) Appl. No.: 11/073,052

(22) Filed: Mar. 4, 2005

(65) Prior Publication Data
US 2006/0196418 A1 Sep. 7, 2006

(51) Int. Cl.
C23C 16/00 (2006.01)
C23C 16/458 (2006.01)
C23C 16/46 (2006.01)

(52) U.S. Cl. ........ 118/733; 118/715; 118/724; 118/725; 118/728; 118/729

(58) Field of Classification Search .................. 118/715, 118/724, 725, 728, 729, 733
See application file for complete search history.

(56) References Cited

U.S. PATENT DOCUMENTS

| | | | | |
|---|---|---|---|---|
| 4,412,812 A | * | 11/1983 | Sadowski et al. | 432/121 |
| 4,699,805 A | * | 10/1987 | Seelbach et al. | 438/680 |
| 4,745,088 A | * | 5/1988 | Inoue et al. | 117/98 |
| 5,015,330 A | * | 5/1991 | Okumura et al. | 438/694 |
| 5,016,567 A | * | 5/1991 | Iwabuchi et al. | 118/733 |
| 5,273,586 A | * | 12/1993 | Kim et al. | 118/723 E |
| 5,320,680 A | * | 6/1994 | Learn et al. | 118/724 |
| 5,421,892 A | * | 6/1995 | Miyagi | 118/724 |
| 5,458,688 A | * | 10/1995 | Watanabe | 118/724 |
| 5,462,397 A | * | 10/1995 | Iwabuchi | 414/217 |
| 5,482,559 A | * | 1/1996 | Imai et al. | 118/728 |
| 5,509,967 A | * | 4/1996 | Kyogoku et al. | 118/724 |
| 5,536,320 A | * | 7/1996 | Ushikawa et al. | 118/719 |
| 5,653,810 A | * | 8/1997 | Kataoka et al. | 118/723 E |
| 6,015,590 A | | 1/2000 | Suntula et al. | 427/255.23 |
| 6,106,626 A | * | 8/2000 | Guan et al. | 118/715 |
| 6,235,121 B1 | * | 5/2001 | Honma et al. | 118/730 |
| 6,534,431 B1 | | 3/2003 | Suntula et al. | 502/60 |
| 6,585,823 B1 | * | 7/2003 | Van Wijck | 117/89 |
| 6,660,126 B2 | | 12/2003 | Nguyen et al. | 156/345.34 |
| 6,869,500 B2 | * | 3/2005 | Lee et al. | 156/345.37 |
| 6,879,778 B2 | * | 4/2005 | Yoo et al. | 392/416 |
| 6,884,295 B2 | * | 4/2005 | Ishii et al. | 118/715 |
| 6,905,549 B2 | * | 6/2005 | Okuda et al. | 118/715 |
| 7,022,184 B2 | * | 4/2006 | Van Wijck | 117/201 |

(Continued)

FOREIGN PATENT DOCUMENTS

EP 1463093 A2 9/2004
(Continued)

OTHER PUBLICATIONS

Suntola, T., "Atomic Layer Epitaxy", 1989, Material Science Reports, North Holland Amsterdam, pp. 261-312.

(Continued)

*Primary Examiner* — Jeffrie R Lund
(74) *Attorney, Agent, or Firm* — Harrington & Smith

(57) ABSTRACT

An apparatus for depositing conformal thin films by sequential self saturating chemical reactions on heated surfaces is disclosed. The apparatus comprises a movable single or dual-lid system that has a substrate holder attached to a reaction chamber lid. In other embodiments, the apparatus comprises an exhaust flow plug, a gas distribution insert, a local heater or a minibatch system. Various methods suitable for ALD (Atomic Layer Deposition) are also enclosed.

15 Claims, 16 Drawing Sheets

U.S. PATENT DOCUMENTS

| | | | |
|---|---|---|---|
| 7,056,806 B2 * | 6/2006 | Basceri et al. | 438/448 |
| 7,258,892 B2 * | 8/2007 | Beaman et al. | 427/8 |
| 7,311,520 B2 * | 12/2007 | Saito et al. | 432/247 |
| 7,422,635 B2 * | 9/2008 | Zheng et al. | 118/715 |
| 7,432,475 B2 * | 10/2008 | Nakajima et al. | 219/390 |
| 2003/0049372 A1 * | 3/2003 | Cook et al. | 427/248.1 |
| 2003/0066483 A1 | 4/2003 | Lee et al. | 118/715 |
| 2003/0077388 A1 * | 4/2003 | Byun | 427/255.28 |
| 2003/0121469 A1 * | 7/2003 | Lindfors et al. | 117/105 |
| 2003/0121608 A1 | 7/2003 | Chen et al. | 156/345.33 |
| 2003/0150385 A1 | 8/2003 | Bondestam et al. | 118/722 |
| 2003/0180458 A1 | 9/2003 | Sneh | 427/248.1 |
| 2003/0183171 A1 | 10/2003 | Sneh et al. | 118/724 |
| 2003/0213435 A1 * | 11/2003 | Okuda et al. | 118/724 |
| 2004/0007176 A1 * | 1/2004 | Janakiraman et al. | 118/715 |
| 2004/0063276 A1 * | 4/2004 | Yamamoto et al. | 438/241 |
| 2004/0065256 A1 | 4/2004 | Kim et al. | 118/715 |
| 2004/0083960 A1 | 5/2004 | Dando | 118/715 |
| 2004/0094091 A1 * | 5/2004 | Yang et al. | 118/715 |
| 2005/0039680 A1 * | 2/2005 | Beaman et al. | 118/715 |
| 2005/0039686 A1 * | 2/2005 | Zheng et al. | 118/728 |
| 2005/0045102 A1 * | 3/2005 | Zheng et al. | 118/722 |
| 2005/0066993 A1 * | 3/2005 | Hasebe et al. | 134/1 |
| 2005/0187647 A1 * | 8/2005 | Wang et al. | 700/100 |
| 2006/0021582 A1 * | 2/2006 | Saito et al. | 118/724 |
| 2006/0115957 A1 * | 6/2006 | Basceri et al. | 438/448 |
| 2006/0196418 A1 * | 9/2006 | Lindfors et al. | 118/715 |
| 2006/0205187 A1 * | 9/2006 | Zheng et al. | 438/478 |
| 2006/0213440 A1 * | 9/2006 | Zheng et al. | 118/715 |
| 2007/0026642 A1 * | 2/2007 | Hishiya | 438/478 |
| 2007/0074660 A1 * | 4/2007 | Park et al. | 118/715 |
| 2009/0263578 A1 * | 10/2009 | Lindfors et al. | 427/248.1 |
| 2009/0297710 A1 * | 12/2009 | Lindfors | 427/255.28 |
| 2010/0028122 A1 * | 2/2010 | Lindfors et al. | 414/806 |

FOREIGN PATENT DOCUMENTS

| | | | |
|---|---|---|---|
| JP | 60152675 A | * | 8/1985 |
| JP | 61027626 A | * | 2/1986 |
| JP | 62027570 A | * | 2/1987 |
| JP | 62047134 A | * | 2/1987 |
| JP | 62290126 A | * | 12/1987 |
| JP | 01019719 A | * | 1/1989 |

OTHER PUBLICATIONS

Suntola, T., "Atomic Layer Epitaxy", ©1994 Elsevier Science B.V., Handbook of Crystal Gorwth, vol. 3, pp. 601-663.

Ritala, M. et al., "Atomic Layer Deposition", 2002, Handbook of Thin Film Materials, vol. 1, pp. 103-159.

Suntola, T., "30 Years of ALD", Aug. 16-18, 2004, University of Helsinki, Finland, 47 pgs.

* cited by examiner

APPARATUSES AND METHODS FOR DEPOSITION OF MATERIAL ON SURFACES

FIELD OF THE INVENTION

The present invention generally relates to the deposition of material on a surface. More particularly, but not exclusively, the invention relates to the deposition of material on heated surfaces by sequential self-saturating surface reactions below the atmospheric pressure, and to an apparatus and a method for growing conformal thin films.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two precursor species to a substrate that is located within a heated reaction space. The growth mechanism of ALD relies on the bond strength differences between chemical adsorption (chemisorption) and physical adsorption (physisorption). During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

By definition the reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of nitrogen or oxygen precursor vapor. Inactive gas, such as nitrogen or argon, and a vacuum pump are used for purging gaseous reaction by-products and the residual reactant molecules from the reaction space. A deposition sequence contains at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown from trimethyl aluminum $(CH_3)_3Al$, also referred to as TMA, and water at 250-300° C. has usually about 1% non-uniformity over the 100-200 mm wafer. Metal oxide thin films grown by ALD are suitable for gate dielectrics, electroluminescent display insulators and capacitor dielectrics. Metal nitride thin films grown by ALD are suitable for diffusion barriers, e.g., in dual damascene structures. Precursors for the ALD growth of thin films and thin film materials deposited by the ALD method are disclosed, for example, in a review article M. Ritala et al., *"Atomic Layer Deposition", Handbook of Thin Film Materials, Volume 1: Deposition and Processing of Thin Films*, Chapter 2, Academic Press, 2002, p. 103, which is incorporated herein by reference.

Apparatuses suited for the implementation of ALE and ALD methods are disclosed, for example, in review articles T. Suntola, *"Atomic Layer Epitaxy", Materials Science Reports*, 4(7) 1989, Elsevier Science Publishers B.V., p. 261, and T. Suntola, *"Atomic Layer Epitaxy", Handbook of Crystal Growth 3, Thin Films and Epitaxy, Part B: Growth Mechanisms and Dynamics*, Chapter 14, Elsevier Science Publishers B.V., 1994, p. 601, which are incorporated herein by reference.

A batch ALD reactor, disclosed in U.S. patent application publication no. 2003/0121469 A1 that is incorporated herein by reference, contains multiple substrates and a folded gas flow path. Long flow path causes problems with processes where reaction by-products can re-adsorb on the substrate surface and block reactive surface sites.

An ALD reactor, disclosed in U.S. patent application publication no. 2003/0121608 A1 that is incorporated herein by reference, has a stationary lid with an attached gas in-feed system and a susceptor that can be lowered for accessing the substrate through a gate valve. On top of the lid there is a narrow gas mixing volume for forming uniform gas mixture before letting the gases into the substrate space.

An ALD reactor, disclosed in U.S. Pat. No. 6,660,126 that is incorporated herein by reference, has a gas pulsing system integrated with a reaction chamber lid and a susceptor that can be lowered to access the substrate through a gate valve. One of the problems with the design is that pulsing valve attached directly to the lid are rather vulnerable to gas leaks, which may result in non-uniform CVD (Chemical Vapor Deposition) growth of film on the substrate.

A single wafer ALD reactor, disclosed in U.S. patent application publication no. 2003/0150385 that is incorporated herein by reference, has a stationary lid and a susceptor (substrate holder) that can be lowered for accessing the substrate. Precursor vapors are fed to the reaction chamber from one side of the reaction chamber and gases are evacuated from the opposite side of the reaction chamber.

A CVD system, disclosed in U.S. patent application publication no. 2004/0065256 that is incorporated herein by reference, has a lid with gas conduits for reactive cleaning gas and a showerhead placed under the lid.

An ALD reactor, disclosed in U.S. patent application publication no. 2003/0183171 that is incorporated herein by reference, has a hot pre-reactor surface inside a showerhead. The substrate is accessed from a side of the reaction chamber through a gate valve. A problem with the reactor is that the expensive gate valve is exposed to the process temperature, which may drastically shorten the lifetime of the gate valve.

An ALD reactor, disclosed in U.S. patent application publication no. 2003/0180458 that is incorporated herein by reference, has a stationary lid, a gas distributor chamber and a nozzle array.

An ALD reactor, disclosed in U.S. Pat. No. 6,585,823 that is incorporated herein by reference, has a susceptor stack for processing a batch of substrates. The susceptor stack is lowered vertically from the reaction chamber so that the substrates can be accessed. Precursor vapor is fed to the reaction chamber from the bottom side of the chamber and evacuated from the top side of the chamber. A problem with the reactor is that the reaction by-products, such as hydrogen chloride HCl, can readsorb on the surfaces of the down stream side substrates causing non-uniform film growth.

An ALD reactor for coating particles, disclosed in U.S. Pat. No. 6,534,431 that is incorporated herein by reference, has a reaction chamber for coating solid particles. A problem with the reactor is that when the reactor is pressurized to atmospheric pressure and the flange of the reactor tube is opened for accessing the coated particles, any solid precursor left within the source tube is exposed to room air because the source tube is in fluid communication with the reaction chamber. It means that fresh reactive precursor must be loaded into the source tube before each deposition process.

Finally, a CVD/ALD reactor, disclosed in U.S. patent application publication no. 2004/0083960 that is incorporated herein by reference, has a reaction chamber, a lid attachable to the reaction chamber, and a connector. The connector has a first portion coupled to the lid, a second portion coupled to the reaction chamber, a gas passageway extending through the first portion and the second portion, and a seal between the first and second portions surrounding the gas passageway. The first and second portions of the connector are detachably coupled to each other.

The preceding description shows that there exist various ALD/CVD reactors with various problems. One general problem is that, in most known reactors, the top part of the reactor must laboriously be disassembled before the reaction chamber can be serviced. Also, the footprint of these reactors is rather large and they typically have high electrical power consumption.

SUMMARY OF THE INVENTION

It is an object of embodiments of the invention to provide a compact ALD reactor for R&D and production purposes with a reaction chamber and a substrate holder that can be accessed from the top side of the reaction chamber. A further object is to provide a modular ALD reactor that can be tailored for specific applications relating to the coating of single substrates, multiple substrates and solid particles. A still further object is to provide an ALD reactor that allows step-wise propagation from R&D stage to production stage without substantial structural alterations to the said ALD reactor.

According to a first aspect of the invention an apparatus for the deposition of material on a substrate is provided, the apparatus comprising:
a reaction chamber lid for forming a lid to a reaction chamber, the reaction chamber being a place in which said deposition of material is arranged to take place; and
a substrate holder for receiving said substrate and for holding the substrate in the reaction chamber during deposition, and wherein said substrate holder is integratable or integrated with said reaction chamber lid.

In an embodiment, said substrate holder is movable in the apparatus together with said reaction chamber lid in a vertical direction into a substrate loading/unloading station.

In another embodiment, the apparatus further comprises a vacuum chamber lid for forming a lid to a vacuum chamber, wherein said vacuum chamber lid is integratable or integrated with said reaction chamber lid in order to form a dual-lid system.

The apparatus may be intended for growing material or thin films on heated surfaces by sequential self-saturating surface reactions below the atmospheric pressure, the apparatus thereby being an ALD-apparatus (Atomic Layer Epitaxy) or similar. The desired thickness of the thin films would typically be in the area extending from one monolayer or molecular layer up to 1000 nm or further.

The vacuum chamber lid, reaction chamber lid and/or the substrate holder can be made from a single piece or as an assembly comprising more than one piece.

In an embodiment, the reaction chamber lid comprises a mesh or a perforated plate that extends substantially across the bottom side of an expansion volume formed by the reaction chamber lid and is attachable or attached to the bottom side of said reaction chamber lid.

Further, in an embodiment, said apparatus comprises, at least two precursor sources, a vacuum generator such as a vacuum pump or a venturi, an inactive gas source, a lifting mechanism for controlling the position of the movable single or dual lid and an automated process control system.

In yet another embodiment, the apparatus comprises a heating means for heating the reaction chamber and a local heating means inside the reaction chamber for heating the substrate holder. The local heating means may by separate from said substrate holder but may touch the substrate holder while in heating position.

According to a second aspect of the invention a reactor for the deposition of material on a substrate is provided, the reactor comprising:
at least one in-feed line in order to guide gas into a reaction space of the reactor; and at least one exhaust line in order to guide gas away from the reaction space of the reactor, wherein the reactor further comprises:
an exhaust flow plug arranged to provide the reactor with an exhaust flow control.

In an embodiment, said exhaust flow plug is arranged to prevent or restrict gas from flowing from said reaction space to said exhaust line during a gas exposure period. Said exhaust flow plug may be connected or connectable to a further element capable of generating movement, such as a bellows, in order to adjust the position of the plug.

According to a third aspect of the invention an apparatus for the deposition of material on a substrate is provided, the apparatus comprising:
a substrate holder for receiving a substrate and for holding said substrate in a reaction chamber during deposition, the substrate holder being attached to a reaction chamber lid with a set of support rods; and
a gas distribution channel inside a support rod, and an aperture in a side-wall of said support rod for guiding gas via said gas distribution channel and said aperture towards said substrate.

In an embodiment, this apparatus comprises a minibatch system comprising:
more than one substrate holders placed substantially on top of each other for receiving substrates and for holding the substrates in a reaction chamber during deposition, the substrate holders being attached to the reaction chamber lid with the aid of one or more support rods; and a gas distribution channel inside each or at least one support rod for guiding gas inside said support rod(s), wherein said each or at least one support rod has a set of apertures through which gas flowing in the gas distribution channel(s) can be delivered to a respective substrate.

According to a fourth aspect of the invention a flow distributor insert to be inserted inside a reaction chamber to a reaction chamber lid that comprises at least two entrance conduits and an expansion volume is provided, wherein the flow distributor insert substantially fills the expansion volume, the flow distributor insert comprising:
a set of flow rakes physically separated from each other, wherein each flow rake comprises:
a lateral spreader and a number of flow channels so that the lateral spreader is in fluid communication with the corresponding entrance conduit, one end of each flow channel is in fluid communication with the corresponding lateral spreader and the remaining portion of each flow channel has a plurality of apertures on its lower surface for guiding gas towards a reaction space through said apertures.

In an embodiment, the flow distributor insert comprises two flow rakes having interspersed flow channels in a first level and one or two flow rakes having interspersed flow channels in a second level, said second level being above said first level.

According to a fifth aspect of the invention a method for the deposition of material on at least one substrate in an apparatus that comprises a reaction chamber having a place for at least one substrate is provided, the apparatus further comprising at least two in-feed lines with entrance conduits for guiding gas to the reaction chamber, the method comprising:
guiding a gas flow comprising reactive gas into the reaction chamber via one in-feed line and the corresponding entrance conduit selected from said at least two in-feed lines with entrance conduits;
and simultaneously guiding a small inactive gas flow towards the reaction chamber via one or more in-feed lines with entrance conduit(s) that are, at the time, not used for guiding the gas flow comprising reactive gas into the reaction chamber, whereby said small inactive gas flow forms a counter-pressure for preventing reactive gas from flowing into said one or more in-feed lines with entrance conduit(s) that are used for guiding the small inactive gas flow towards the reaction chamber.

It should be clear for a skilled person that the various aspects, although presented as separate aspects, can be combined in any suitable way. Also, the embodiments disclosed in the specification and the subject-matter of dependent claim relating to one aspect can be applied to other aspects of the invention.

BRIEF DESCRIPTION OF THE DRAWINGS

In the following, the invention will be described in more detail with the help of exemplifying embodiments illustrated in the appended drawings, in which like reference numbers are employed for similar features in different embodiments and, in which.

DETAILED DESCRIPTION

Without wishing to be restricted by the following explanations and theoretical considerations, embodiments of apparatuses and methods for growing material or a thin film on one or more substrates will now be described in detail with the help of figures and examples. The scope of the invention is not meant to be limited to the examples. A person skilled in the art will understand that variations of the apparatuses and the methods can be constructed without departing from the scope of the invention.

According to an embodiment an ISO fitting (e.g. ISO 320, ISO 400 or ISO 500 flange or nipple) is the basic building block of an ALD reactor, although other fittings (e.g. CF fittings) can also be utilized in other embodiments. The width of the fitting is large enough to accommodate heater(s), heat reflectors and a reaction chamber for 100-300 mm wafers. On the other hand, the fitting is compact enough so that the whole reactor with at least two precursor sources can be built within a 700 mm×700 mm footprint while the height of the reactor is less than 1000 mm without a load lock.

Figure 1:
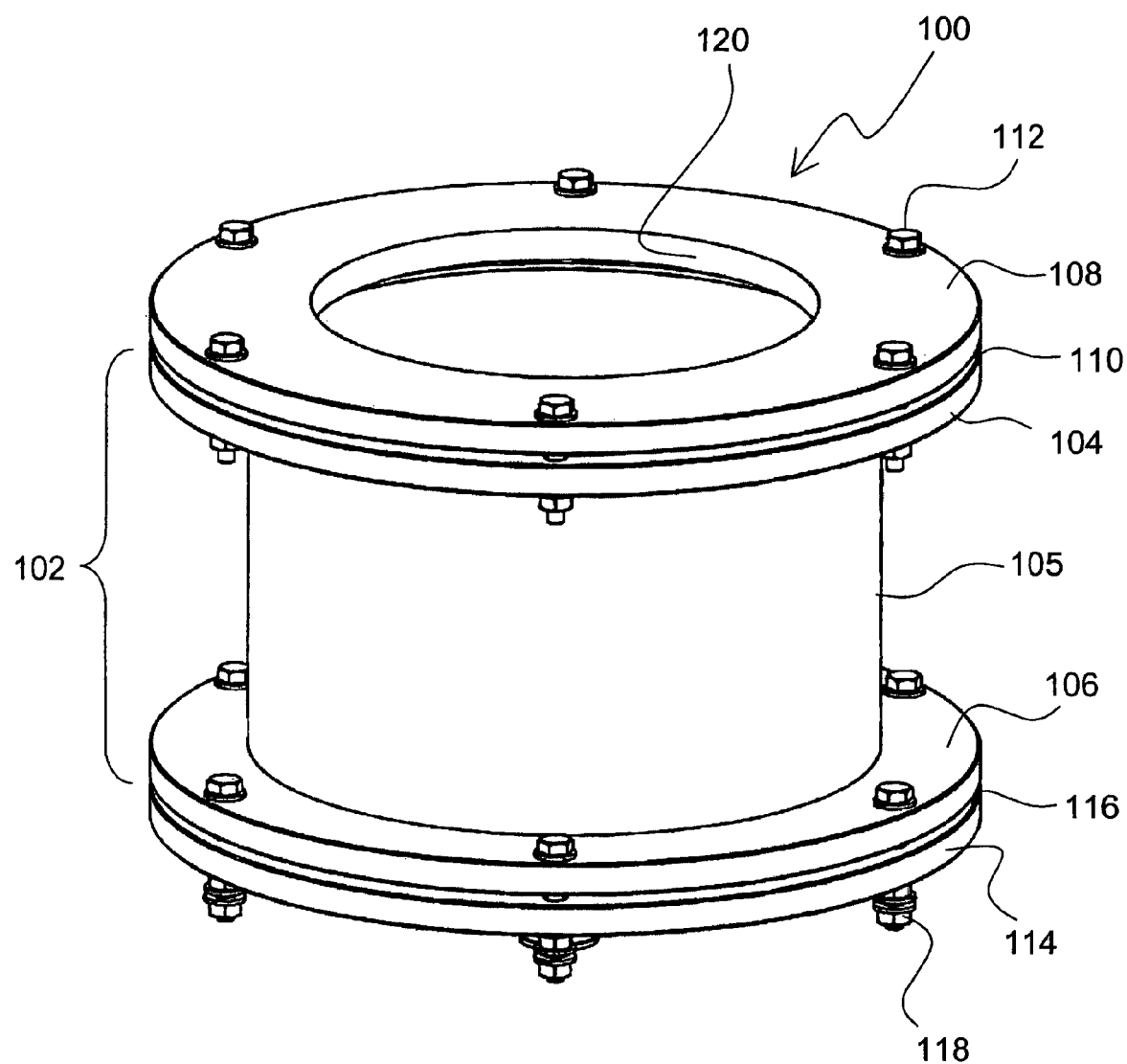
FIG. 1 is a schematic drawing of an ALD vacuum chamber consisting of an ISO full nipple and two flanges bolted to the nipple.

FIG. 1 depicts a schematic view of a vacuum chamber 100 of an ALD reactor. According to an embodiment a standard size ISO full nipple is used as the vacuum chamber 100, for example an ISO 400 full nipple 102 that contains a top flange 104, a hollow fitting body 105 and a bottom flange 106. The full nipple is usually made of 304 or 316L stainless steel. Other materials, such as titanium metal, are possible in other embodiments. An upper interface flange 108 together with a top seal 110 (not clearly visible) has been attached with bolts 112 on to the top flange 104 of the nipple 102. The top seal 110 may be, e.g., a standard o-ring seal placed in a groove machined in the top surface of the top flange 104 or in the bottom surface of the upper interface flange 108. The upper interface flange 108 has a hole 120 that has a width. A bottom flange 106 together with a bottom seal 116 (not clearly visible) has been attached with bolts 118 on to a lower interface flange 114. The bottom seal 116 may be, e.g., a standard o-ring seal placed in a groove machined in the bottom surface of bottom flange 106 or in top surface of the lower interface flange 114. Alternatively, the bottom seal 116 (and/or the top seal 110) may be implemented by an o-ring seal and a support ring placed in between the flanges 106 and 114 (104 and 108, respectively). Yet alternatively, the bottom seal 116 (and/or the top seal 110) may be a c-metal seal. According to another embodiment the vacuum chamber 100 is manufactured from two ISO half nipples so that the length of fitting bodies is adjusted to suit the purpose and the open ends of the bodies are then welded together to form a full nipple.

Feed through connectors for inactive gas lines and precursor vapor lines, exhaust line, as well as electricity and measurement cables (not shown in FIG. 1) are attached to the lower interface flange 114. The lower interface flange 114 is in an embodiment without any movable sections so that the feed through connectors, e.g. NW flanges, can permanently be welded or soldered to the said flange. Suitable NW and ISO flanges can be bought, e.g., from Nor-Cal Products, Inc., 1967 So. Oregon, Yreka, Calif. 96097, USA.

Figure 2:
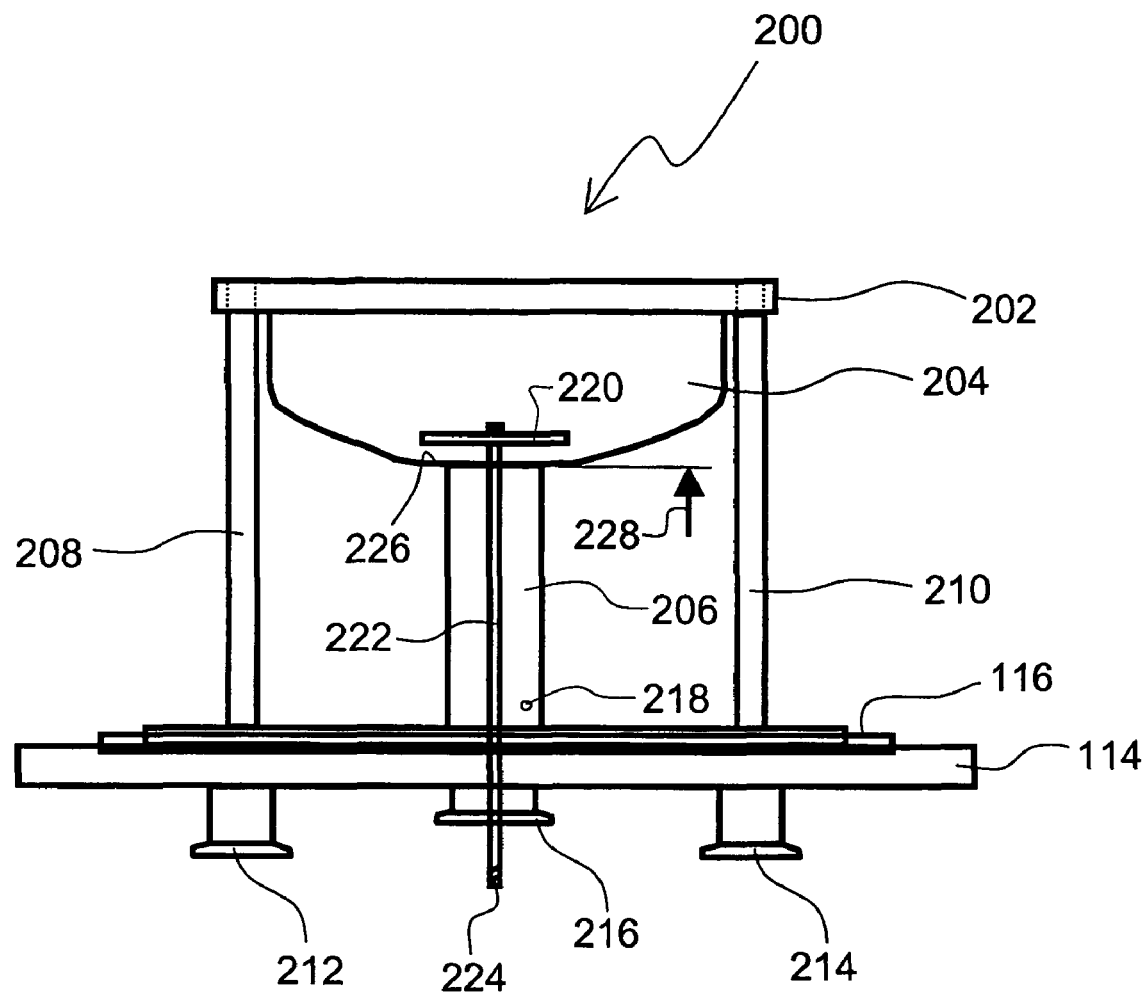
FIG. 2 is a schematic drawing of an ALD reaction chamber with precursor in-feed lines standing on a flange and with an optional movable exhaust flow plug.

FIG. 2 depicts a schematic view of a reaction chamber 200 of an ALD reactor. The reaction chamber 200, to be placed inside the vacuum chamber 100, comprises a ring-like chamber top flange 202, a reaction chamber body 204 and an exhaust guide 206 welded together. Precursor line flanges 212, 214 and an exhaust line flange 216 are welded or soldered to the lower interface flange 114. As described in the foregoing, the bottom seal 116 for sealing the interface between the lower interface flange 114 and the bottom flange 106 (not shown in FIG. 2) can be, e.g., an o-ring seal or a c-metal seal. In an embodiment, the size of the seal is selected so that it fits inside the round area defined by the bolts 118 (FIG. 1). According to one embodiment precursor in-feed lines 208, 210 have been attached to the lower interface flange 114, e.g. by tolerance fitting. The precursor in-feed lines 208, 210 have been attached to the chamber top flange 202, e.g., by welding or soldering. When the reactor is in use, precursor gases flow via the precursor line flanges 212, 214 through the precursor in-feed lines 208, 210 and the chamber top flange 202 to the reaction chamber via a reactor chamber lid (as described later in this description). Inactive shielding gas, e.g. nitrogen ($N_2$), which, in order to generate a shielding pressure difference, is fed into an intermediate space outside the reaction chamber (but inside the vacuum chamber 100) flows from the intermediate space to the exhaust guide 206 through a capillary or a hole 218. Reference numeral 228 indicates the bottom level of the reaction chamber body 204. In other embodiments, reaction chamber bodies of different size and depth can be used.

According to an embodiment an optional exhaust flow plug 220 with a stem 222 is placed inside the reaction chamber body 204. The tip 224 of the stem is further attached e.g. to a bellows (not shown) or another element which generates movement. The bellows can be expanded with pressurized gas so that the bellows raises the exhaust flow plug 220 to an upper position and lets a gas flow conduit form between the bottom 226 of the reaction chamber body 204 and the bottom of the exhaust flow plug 220. When the pressurized gas is evacuated from the bellows, the bellows contracts and the exhaust flow plug 220 drops to a lower position forming a gas flow restriction area against the bottom 226 of the reaction chamber body 204. The exhaust flow control is useful in case the precursor molecules react slowly with the reactive surface sites. During the precursor exposure period the exhaust flow plug 220 is in the lower position and it slows down or essentially prevents the flow of precursor molecules from the reaction space to the exhaust line. During the gas removal period the exhaust flow plug 220 is in the upper position and it lets gas molecules flow freely from the reaction space to the exhaust line.

Figure 3:
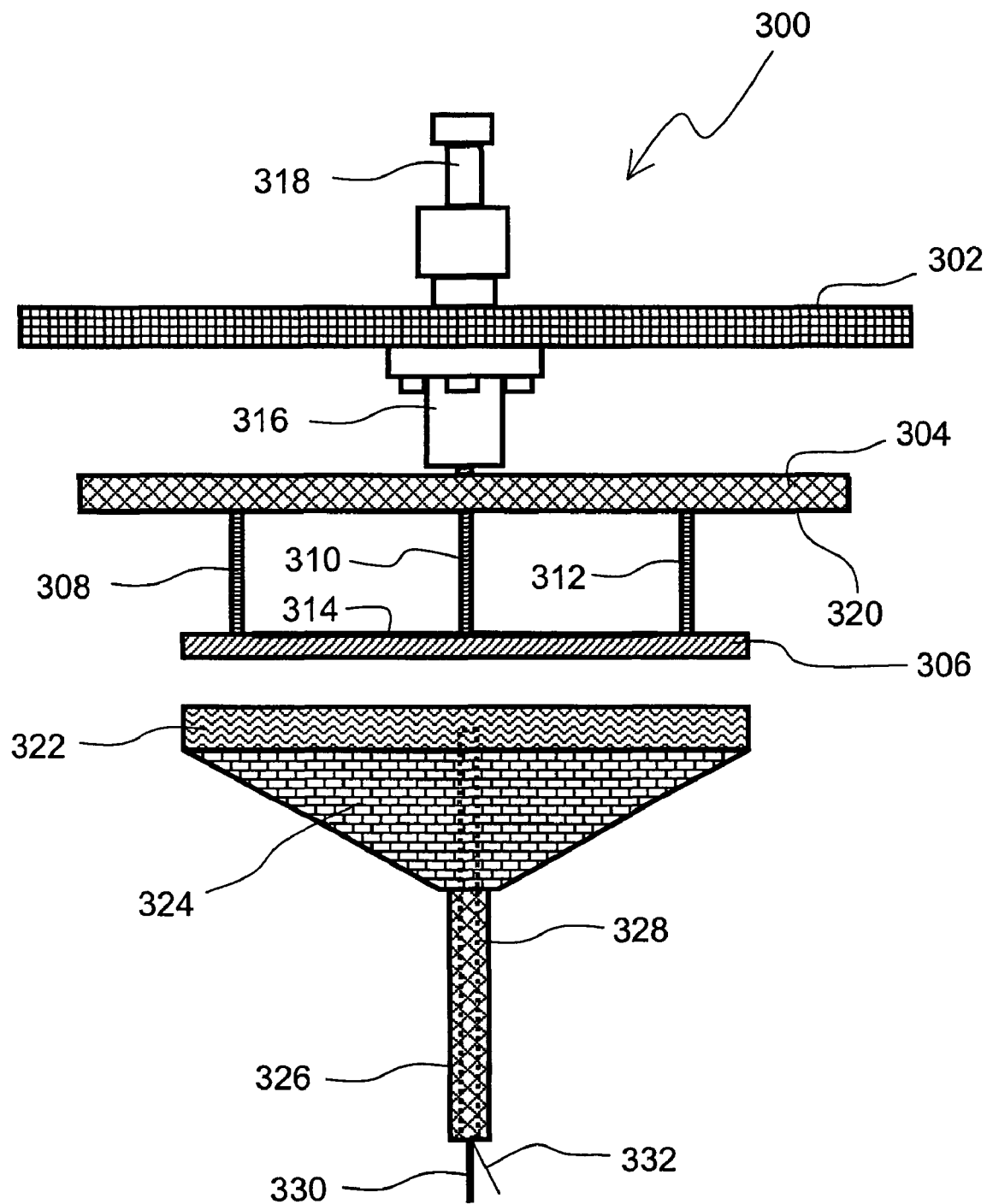
FIG. 3 is a schematic drawing of a single wafer substrate holder integrated to a movable dual lid comprising a reaction chamber lid and a vacuum chamber lid, and a local heater structurally separated from the substrate holder.

FIG. 3 depicts a schematic view of a dual-lid system 300 that can be moved in vertical direction inside the apparatus. The dual-lid system 300 comprises a round vacuum chamber lid 302, a round reaction chamber lid 304, a substrate holder (or susceptor) 306 and support rods 308, 310, 312 for attaching the substrate holder 306 to the reaction chamber lid 304, a lid fastener 316 for attaching the reaction chamber lid 304 to the vacuum chamber lid 302 and a lift fastener 318 for attaching the vacuum chamber lid 302 to a pneumatic lift (not shown). A substrate 314 is placed on the substrate holder 306. The substrate holder 306 may have a recess for receiving the substrate 314.

A smooth sealing surface 320 of the reaction chamber lid 304 is pressed against the smooth upper surface of the chamber top flange 202 (FIG. 2) in order to form a tight reaction chamber. The shielding gas mentioned in the foregoing description takes care that precursor gases keep inside the reaction chamber 200 and do not enter the intermediate space via the interface between the parts 304 and 202. The vacuum chamber lid 302, in turn, is pressed against the upper interface flange 108 with a suitable sealing arrangement (e.g., an o-ring seal or c-metal seal). The size of the vacuum chamber lid 302 is such that it fits inside the round area defined by the bolts 112 (FIG. 1).

In an embodiment a separate local heating means, for example a resistive local heater 328, is used for heating the substrate holder 306 and the substrate 314 to a higher temperature than the reaction chamber body 204 is heated. The local heater 328 is placed, e.g., inside a heat distributor that comprises a flat contact plate 322 and a conical gas flow guide 324. The heat distributor is attached to a tube-like heat distributor support 326 that has smaller diameter than the exhaust guide 206. Gases flow from the reaction chamber through the space between the outer surface of the heat distributor support 326 and the inner surface of the exhaust guide 206 to the exhaust. The local heater 328 has a power connector 330 for feeding in electrical power and a thermoelement connector 332 for measuring the temperature of the heat distributor.

In this embodiment, the local heater 328 is not attached to the substrate holder 306, i.e., it is separate from the substrate holder 306. However, the local heater 328 is arranged in the reaction chamber so that during the deposition process the bottom of the substrate holder 306 touches the top surface of the contact plate 322 and heat flows from the contact plate 322 to the substrate holder 306 and the substrate 314 by conduction until the substrate 314, the substrate holder 306 and the contact plate 322 are at the same deposition temperature. Because the thermal losses of the local heater are quite small at the deposition pressure, the substrate 314 can easily be heated to high temperatures, e.g. to 500° C., while the temperature of the reaction chamber body 204 can be clearly lower, e.g. 300° C., to save power. During the deposition the minimum temperature of the reaction chamber walls should be above the condensation point of the precursors, typically in the range of about 50-350° C. The substrate temperature should also be above the condensation point of the precursors during the deposition and it is typically in the range of 50-550° C. depending on the deposition process.

Figure 4:
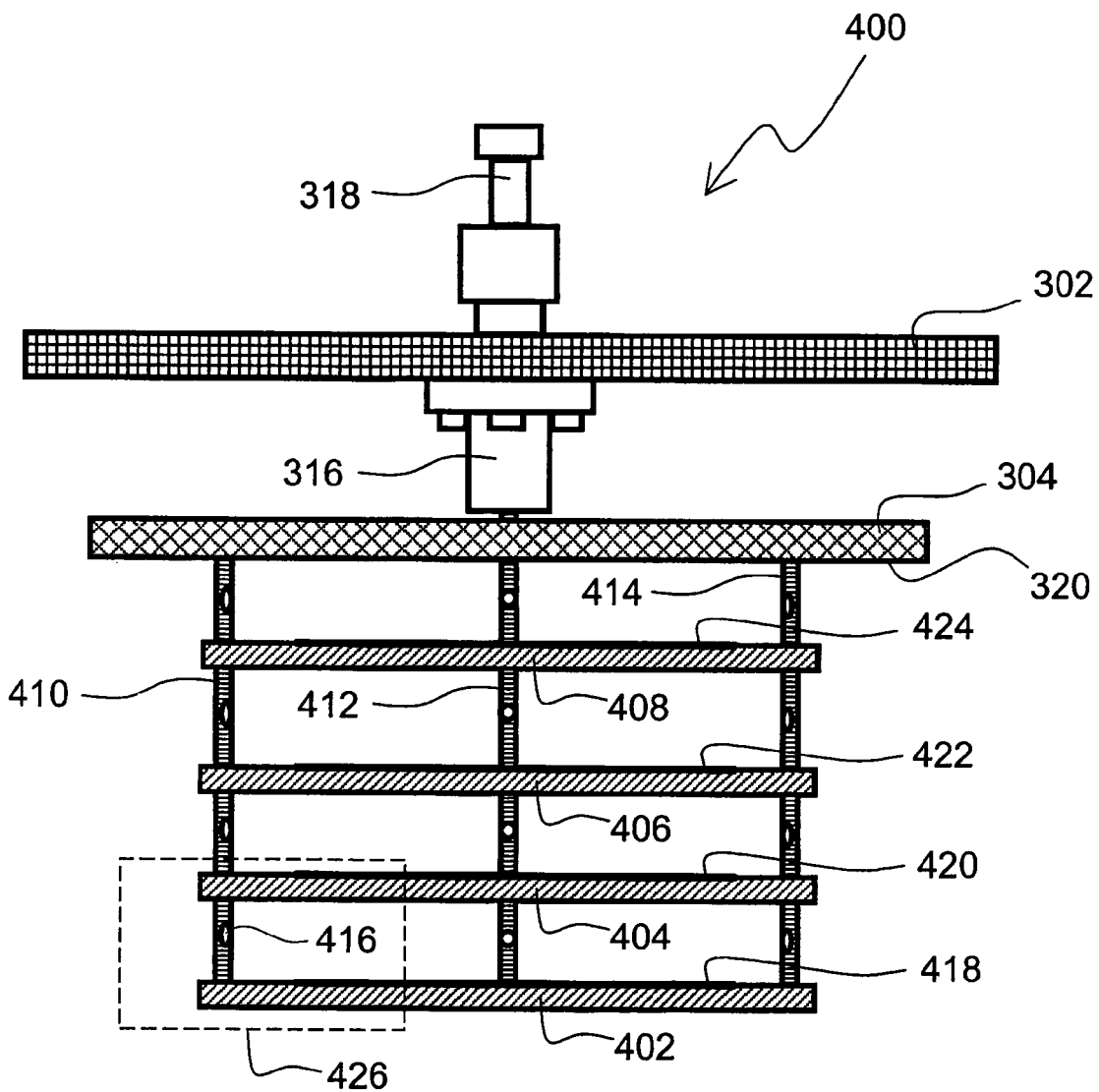
FIG. 4 is a schematic drawing of a minibatch substrate holder integrated to a movable dual lid comprising a reaction chamber lid and a vacuum chamber lid.

FIG. 4 depicts a schematic view of a dual-lid minibatch system 400 that can be moved in the vertical direction inside the apparatus. The dual-lid minibatch system 400 comprises the vacuum chamber lid 302 (FIG. 3), the reaction chamber lid 304, multiple substrate holders 402, 404, 406, 408, and gas distribution tubes 410, 412, 414 for attaching the substrate holders to the reaction chamber lid 304 and for guiding the precursor gases to each substrate 418, 420, 422, 424 via the apertures 416, the lid fastener 316 for attaching the reaction chamber lid 304 to the vacuum chamber lid 302 and a lift fastener 318 for attaching the vacuum chamber lid 302 to a pneumatic lift (not shown).

The reaction chamber lid 304 has channels machined to it (as described later in this description). Incoming precursor gases are conveyed from precursor in-feed lines via these channels into the gas distribution tubes 410, 412, 414 to be uniformly distributed onto the substrates 418, 420, 422, 424 via the apertures 416.

Figure 5:
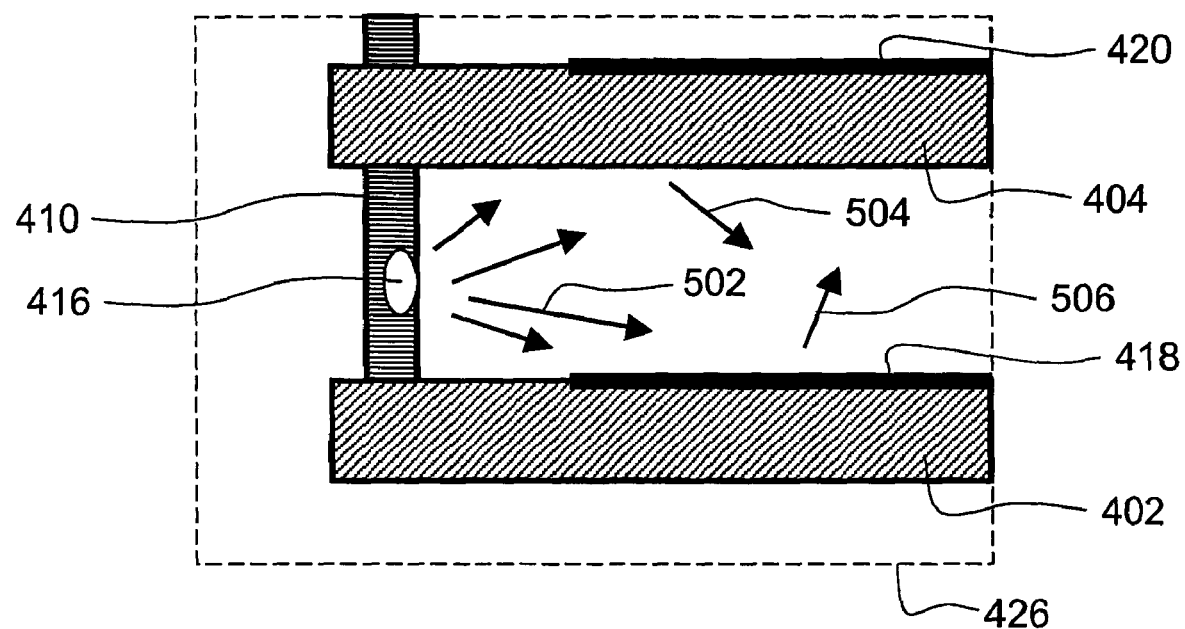
FIG. 5 is a schematic drawing depicting a magnified part of the minibatch substrate holder.

FIG. 5 depicts schematically a magnified part 426 (see FIG. 4) of the dual-lid minibatch system 400. One of the precursor gases is guided along the gas distribution tube 410 through the aperture 416 to a space between two substrate holders 402, 404 so that the substrate 418 is exposed sequentially to each of the precursor gases. Gas stream 502 expands to the space. Some of the precursor molecules bounce 504 from the bottom of the upper substrate holder 404, and some of the molecules bounce 506 from the surface of the substrate 418. In case of low sticking coefficient, multiple collisions of molecules on the surfaces are possible depending on the distance between the substrate 418 and the bottom of the upper substrate holder 404.

Figure 6:
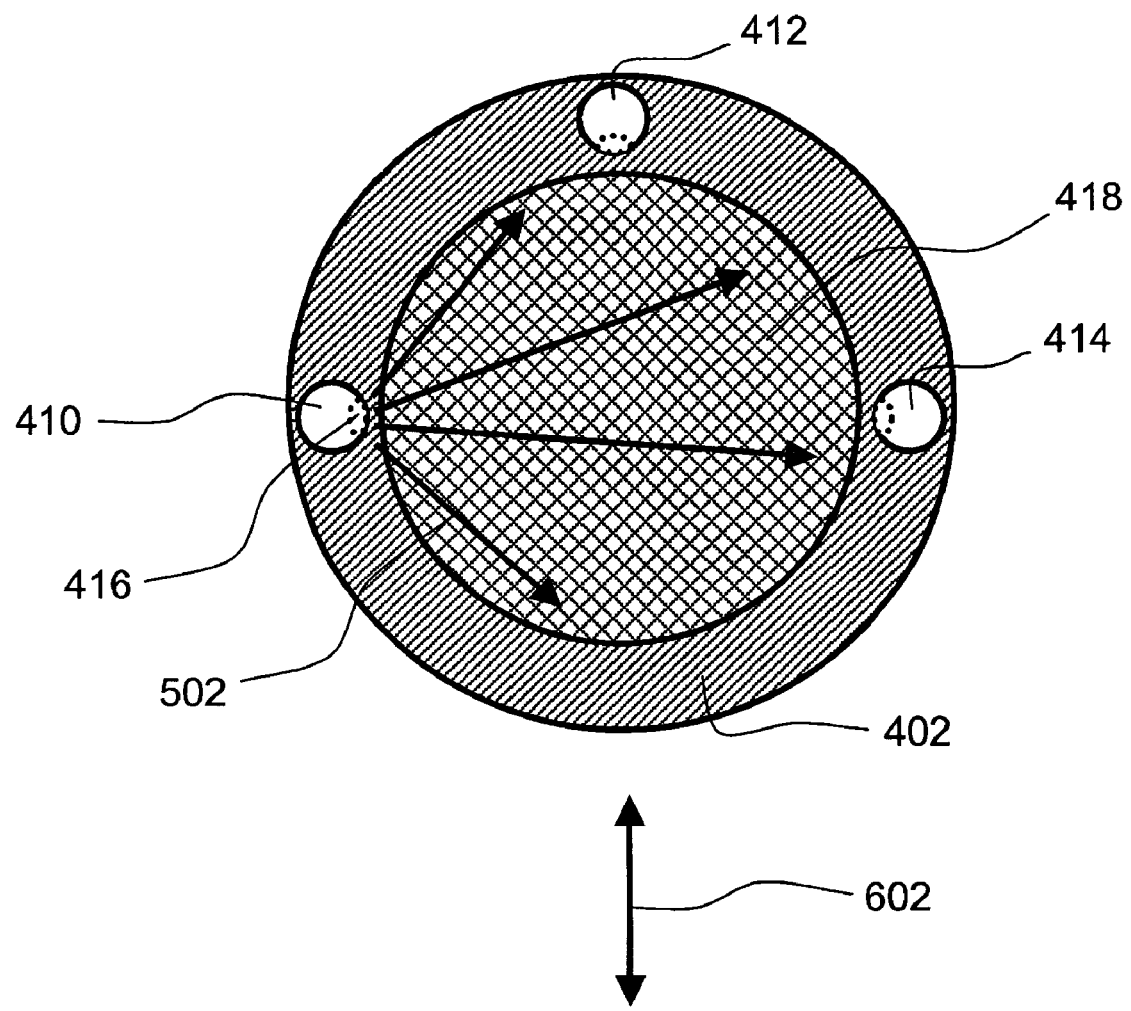
FIG. 6 is a schematic drawing depicting the position of precursor in-feed openings in relation to a substrate in a minibatch substrate holder.

FIG. 6 depicts a schematic view towards one (round) substrate holder 402 of the dual-lid minibatch system 400. Gas distribution tubes 410, 412, 414 have perforations 416 for introducing precursor gases and inactive carrier and purging gas to the space above the substrate 418. Gases expand as indicated with arrows 502 from the aperture 416 so that the whole substrate 418 surface is exposed to the precursor molecules. When the dual-lid minibatch system has been raised up to an upper position for accessing the substrate after a deposition process, the substrate can be unloaded in a direction indicated with an arrow 602.

Figure 7A:
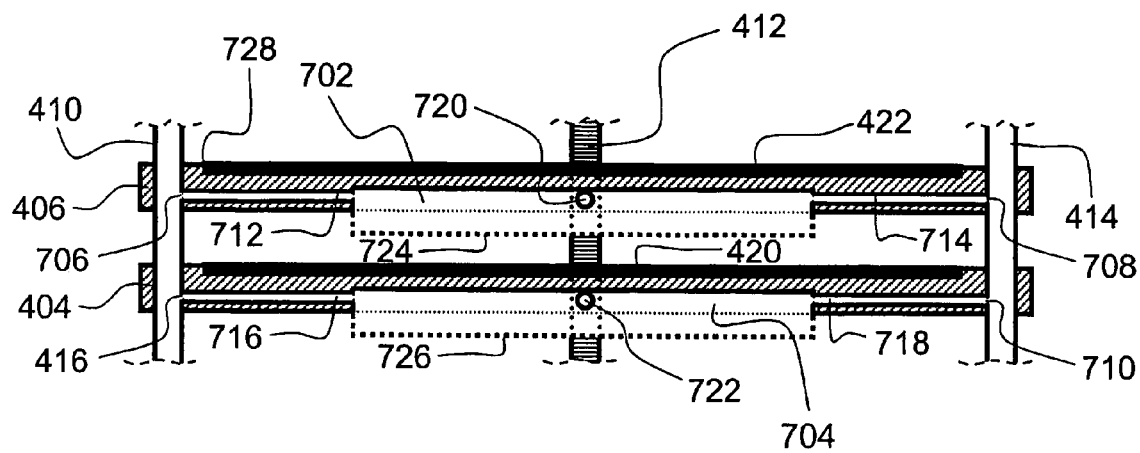
FIG. 7a is a schematic drawing-depicting a side view of substrate holders of a minibatch having integrated gas distributors.
Figure 7B:
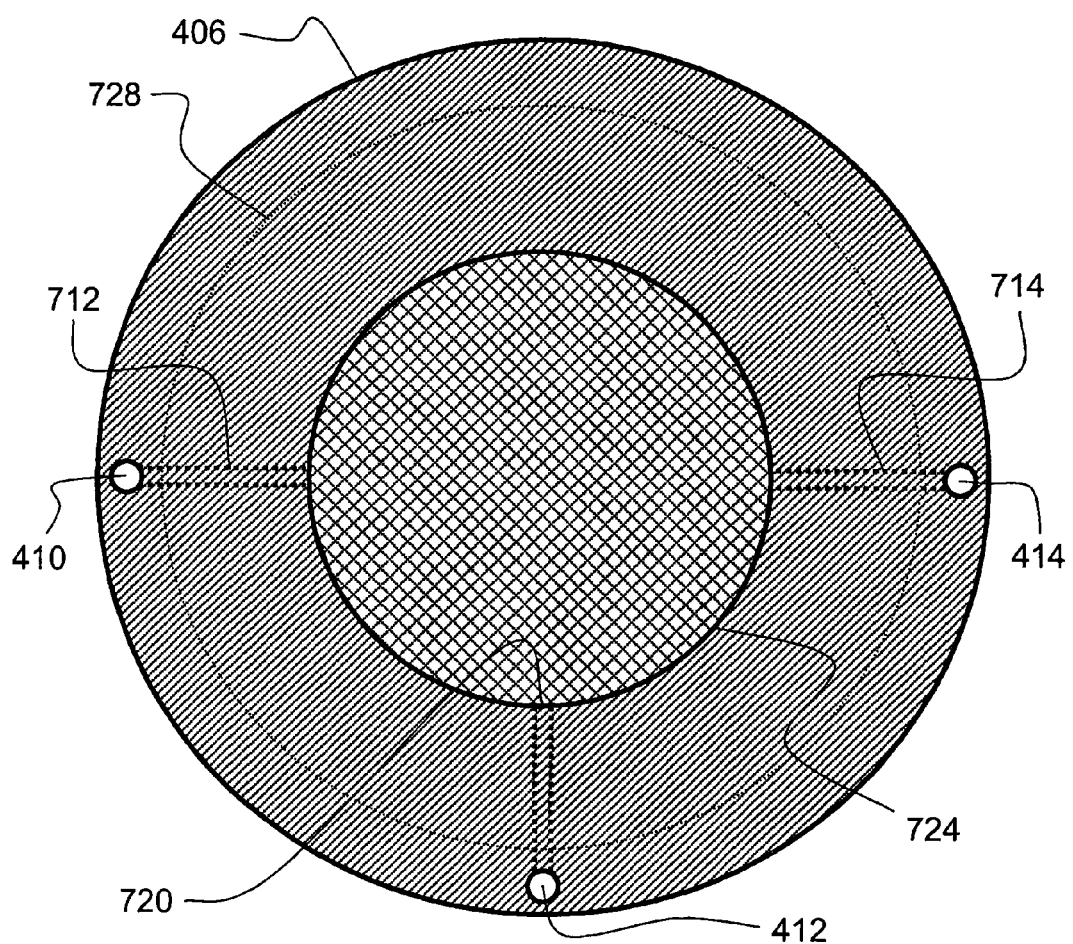
FIG. 7b is a schematic drawing depicting a bottom view of a substrate holder having an integrated gas distributor.

FIGS. 7a and 7b depict a schematic view of two substrate holders 404, 406 of a minibatch system having gas distributors integrated to the substrate holders. The substrate holders 404, 406 are attached to three gas distributor tubes 410, 412, 414 so that channel holes 416, 706, 708, 710 of the tubes match the position of distributor conduits 716, 712, 714, 718 within the substrate holders. Gas flow coming along the first gas distributor tube 410 is divided between the channel holes 706, 416, in this exemplary figure between the first channel hole 706 and the second channel hole 416. Gas flowing through the first channel hole 706 goes then along the first distributor conduit 712, enters an expansion chamber 702 and then flows through a distributor mesh 724 to the space above the substrate 420. Correspondingly, gas flow coming along the second gas distributor tube 412 is divided between channel holes 720, 722 and guided along distributor conduits through the entrance apertures 720, 722 to the corresponding expansion chamber 702, 704 and further through the distributor mesh 724, 726 to the space above the substrates. In the same way gas flow coming along the third gas distributor tube 414 is divided between channel holes 708, 710 and guided along distributor conduits 714, 718 to the local expansion chamber 702, 704. Then the gas flows through the distributor mesh 724, 726 to the space above the substrates. The gas distributor side, i.e., the bottom side of the substrate holder 406 is depicted in FIG. 7b. The edge of the substrate on the other side, i.e., on the top side of the substrate holder 406 is indicated with a dotted line 728.

Figure 8:
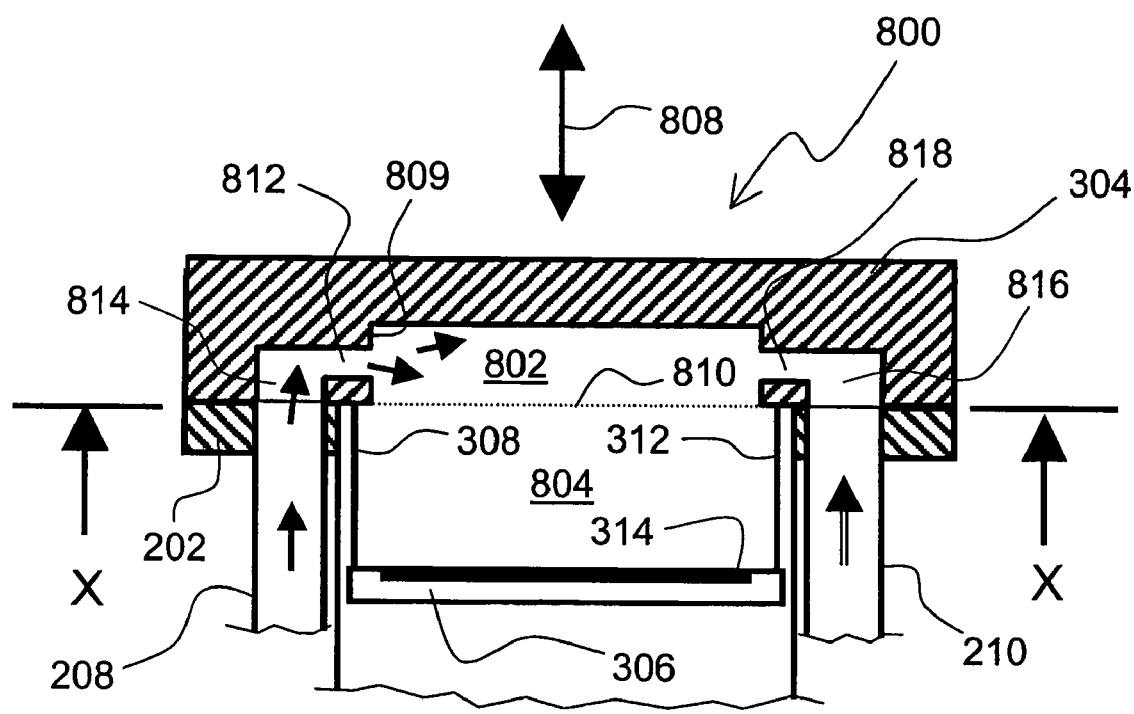
FIG. 8 is a schematic drawing depicting a side view of the ALD reaction chamber with two precursor in-feed lines.

FIG. 8 depicts a schematic side view of the reaction chamber 800 in accordance with an embodiment of the invention. The reaction chamber lid 304 has been lowered on the reaction chamber flange 202 so that a reaction space 804 is formed. An arrow 808 indicates the vertical movement direction of the reaction chamber lid 304. According to one embodiment a mesh 810 or a perforated plate borders a semi open expansions volume 802 and precursor gases flow through the mesh to the reaction space 804 during the deposition process. The mesh helps to create a small pressure difference between the expansion volume 802 and the reaction space 804 (the expansion volume 802 having a higher pressure) so that the precursor vapors coming alternately and sequentially out of the entrance conduits 812, 818 spread more easily in the lateral direction within the expansion volume 802. Reference number 809 refers to the edge of the expansion volume to which the mesh 810 extends.

Figure 9A:
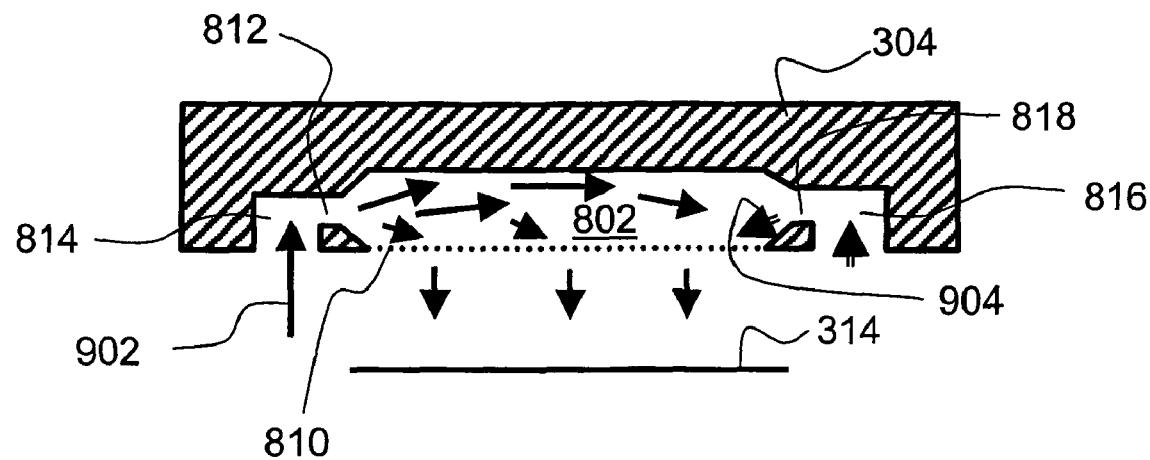
FIG. 9a is a schematic drawing depicting the flow of gases near the reaction chamber lid during a first precursor exposure.

FIG. 9a depicts a schematic side view of the gas flows at the reaction chamber lid 304 during precursor A exposure period. In this example two precursors are used for depositing a solid thin film. The first precursor is trimethyl aluminum TMA (precursor A), the second precursor is water $H_2O$ (precursor B) and thin film material to be deposited is aluminum oxide $Al_2O_3$. TMA vapor is injected into the stream of inactive gas and the resulting gas mixture flows through the precursor A conduit 814 as indicated with an arrow 902. The gas flow turns 90° from a vertical flow to a horizontal flow and exits through the precursor A entrance conduit 812 to the expansion volume 802. The precursor B entrance conduit 818 possesses just a small inactive gas flow towards the expansion volume 802, as indicated with an arrow 904, so that the mixture of precursor vapour and inactive gas flowing from the precursor A entrance conduit 812 is able to expand and fill essentially the whole expansion volume 802. The small inactive gas flow forms a counterpressure which prevents precursor A from flowing into the precursor B conduit 816 or further into the precursor B flow channels. However, the flow rate of the pure inactive gas from the precursor B entrance conduit 818 is small enough to avoid the formation of a gas diffusion barrier within the expansion volume 802.

Gases exit the expansion volume 802 through a flow restrictor 810, which is for example a metal mesh or a perforated plate, into a reaction space where a substrate 314 is located. TMA molecules chemisorb on the substrate 314 surface until available reactive surface sites, namely OH groups, have been consumed and the surface becomes saturated with a molecular layer of the TMA molecules, or more precisely, with the $CH_3Al<$ and $(CH_3)_2Al$— fractions of the TMA molecules. Here, "—" denotes a chemical bond between an Al atom and a surface oxygen atom and "<" denotes two chemical bonds between the Al atom and surface oxygen atoms. The original TMA molecule has three methyl $CH_3$ groups attached to the center Al atom. When the TMA molecule reacts with the surface hydroxyl OH groups, one or two methyl groups receive a hydrogen atom and form gaseous methane $CH_4$ molecules as a reaction by-product.

The surface is now covered with methyl groups. The only way the TMA molecules could adhere to the $CH_3$-covered surface is by physical adsorption (physisorption). However, the substrate temperature is kept above the condensation point of the TMA vapor, so physisorption is not possible and the surplus TMA molecules stay in the gas phase. As a result, only up to a single molecular layer of TMA molecule fractions are able to stay on the substrate surface. When the TMA exposure period ends, TMA vapor is not any longer injected into the stream of inactive gas and the deposition cycle proceeds to a first removal period. The composition of the gas coming from the precursor A entrance conduit 812 changes rapidly from a mixture of TMA vapor and inactive gas into pure inactive gas. Residual TMA molecules and reaction by-product molecules ($CH_4$) are guided from the reaction space towards the exhaust line by flowing inactive gas.

Figure 9B:
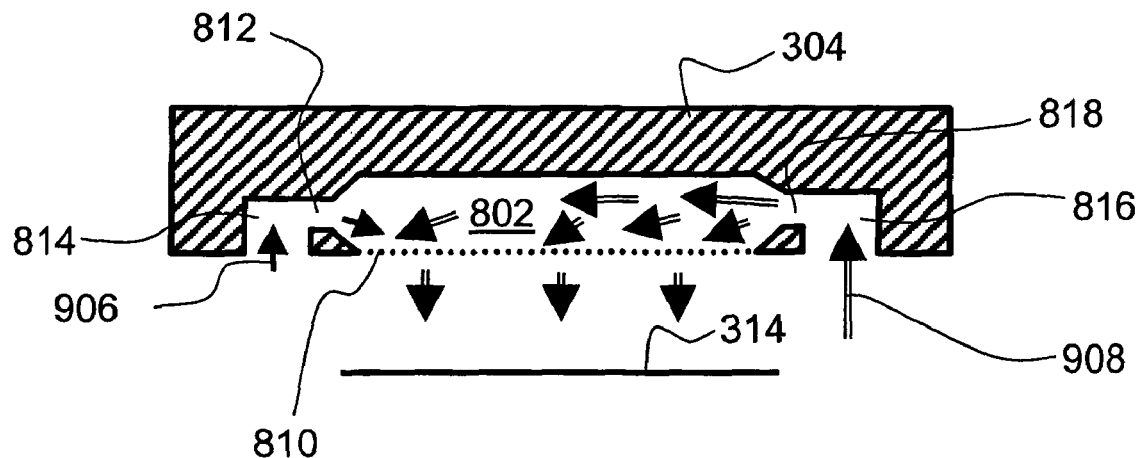
FIG. 9b is a schematic drawing depicting the flow of gases near the reaction chamber lid during a second precursor exposure.

FIG. 9b depicts a schematic side view of the gas flows at the reaction chamber lid 304 during $H_2O$ exposure period. $H_2O$ vapor is injected from the temperature-controlled liquid source through a three-way valve into the stream of inactive gas and the resulting gas mixture flows through the precursor B conduit 816 as indicated with an arrow 908. The gas flow turns 90 degrees from a vertical flow to a horizontal flow and exits through the precursor B entrance conduit 818 to the expansion volume 802. The other precursor conduits, i.e. precursor in-feed lines, have just a small inactive gas flow towards the expansion volume 802, so that the gas flow coming from the precursor B entrance conduit 818 is able to expand and fill essentially the whole expansion volume 802. Pure inactive gas is flowing through the precursor A entrance conduit 812 towards the expansion volume 802 as indicated with an arrow 906. The small inactive gas flow forms a counterpressure which prevents precursor B from flowing into the precursor A conduit 814 or further into the precursor A flow channels. However, the flow rate of the pure inactive gas is selected small enough to prevent the formation of a gas diffusion barrier within the expansion volume 802. Gases exit the expansion volume through a flow restrictor 810 into a reaction space where a substrate 314 is located.

In the reaction space $H_2O$ molecules chemisorb on the substrate 314 surface, which was saturated with TMA molecule fractions during the preceding precursor exposure, until available reactive surface sites, namely surface $CH_3$ groups, have been consumed and the surface becomes saturated with a molecular layer of the hydroxyl OH groups originating from the $H_2O$ molecules. After that the only way the $H_2O$ molecules could adhere to the surface is by physisorption. However, the substrate temperature is kept above the condensation point of the $H_2O$ vapor, so physisorption is not possible and the surplus $H_2O$ molecules stay in the gas phase. As a result, only up to a single molecular layer of $H_2O$ molecule fractions are able to bind to the substrate surface and form thin film material. When the $H_2O$ exposure time ends, $H_2O$ vapor is not any longer injected into the stream of inactive gas and the deposition cycle proceeds to a second removal period.

During the second removal period, the composition of the gas coming from the precursor B entrance conduit 818 changes rapidly from a mixture of $H_2O$ vapor and inactive gas into pure inactive gas. Residual $H_2O$ molecules and reaction by-product molecules, namely methane $CH_4$ molecules, are guided from the reaction space towards the exhaust line by flowing inactive gas. The substrate surface is now uniformly covered with up to a molecular layer of thin film material, in this case aluminum oxide $Al_2O_3$ with surface OH groups. The substrate is now ready for the next TMA vapor exposure. The deposition cycle consisting of the TMA exposure period, the first removal period, the $H_2O$ exposure period and the second removal period is repeated until an $Al_2O_3$ film of desired thickness is obtained.

Figure 10:
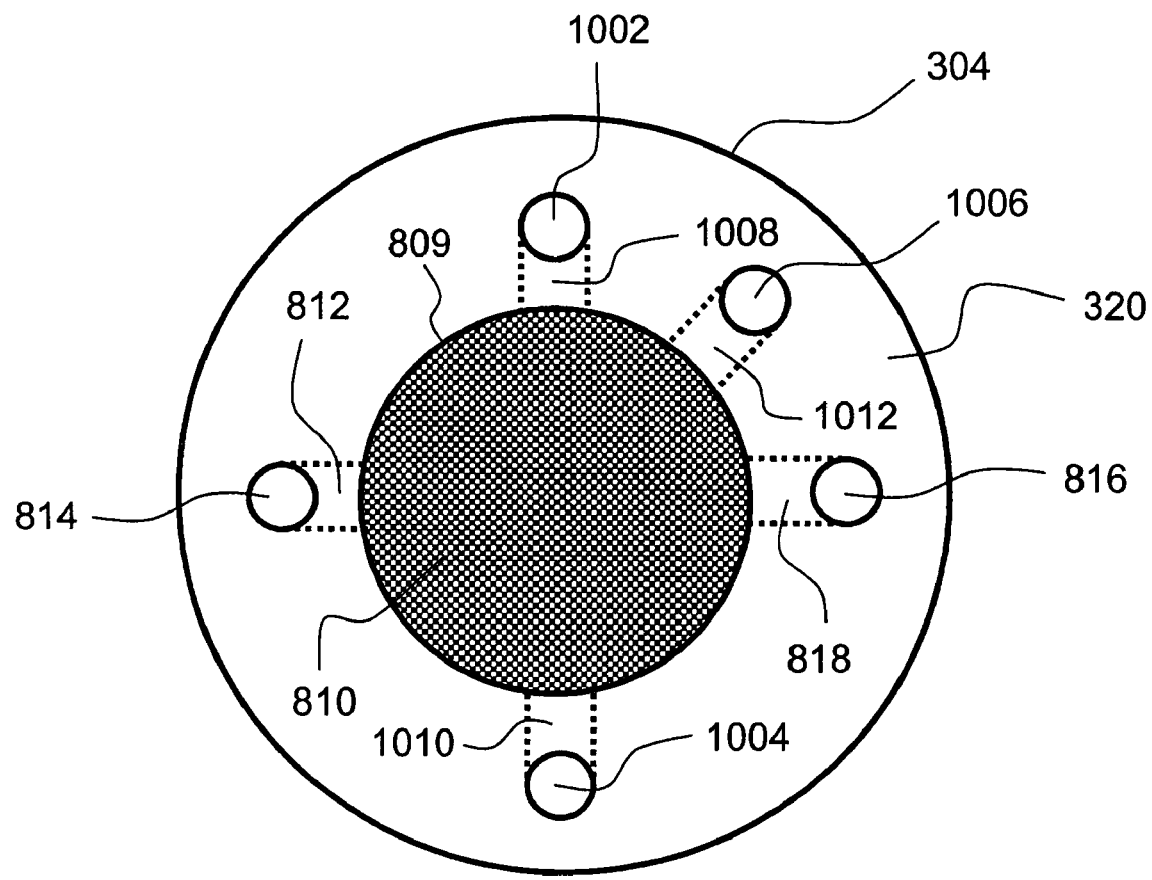
FIG. 10 is a schematic drawing depicting a bottom side view of a reaction chamber lid.

FIG. 10 depicts a schematic view along the X-X section (FIG. 8) of the reaction chamber lid 304 that is in a controlled fluid communication with up to four precursor sources. Machined precursor conduits 814, 816, 1002, 1004 act as flow channel extensions for the gas in-feed tubes (208, 210 in FIG. 8). Gases coming in the said extensions turn to the precursor entrance conduits 812, 818, 1008, 1010 and exit to the expansion volume 802 that is covered with a flow restrictor 810. In addition to the four precursor conduits, an optional screen gas entrance conduit 1012 is machined to the reaction chamber lid 304. Inactive screen gas with a varied mass flow rate coming from the screen gas conduit 1006 flows through the screen gas entrance conduit 1012 to the expansion volume 802 and helps to push residual precursor molecules towards the reaction chamber and further to the exhaust conduit during the removal period.

Figure 11A:
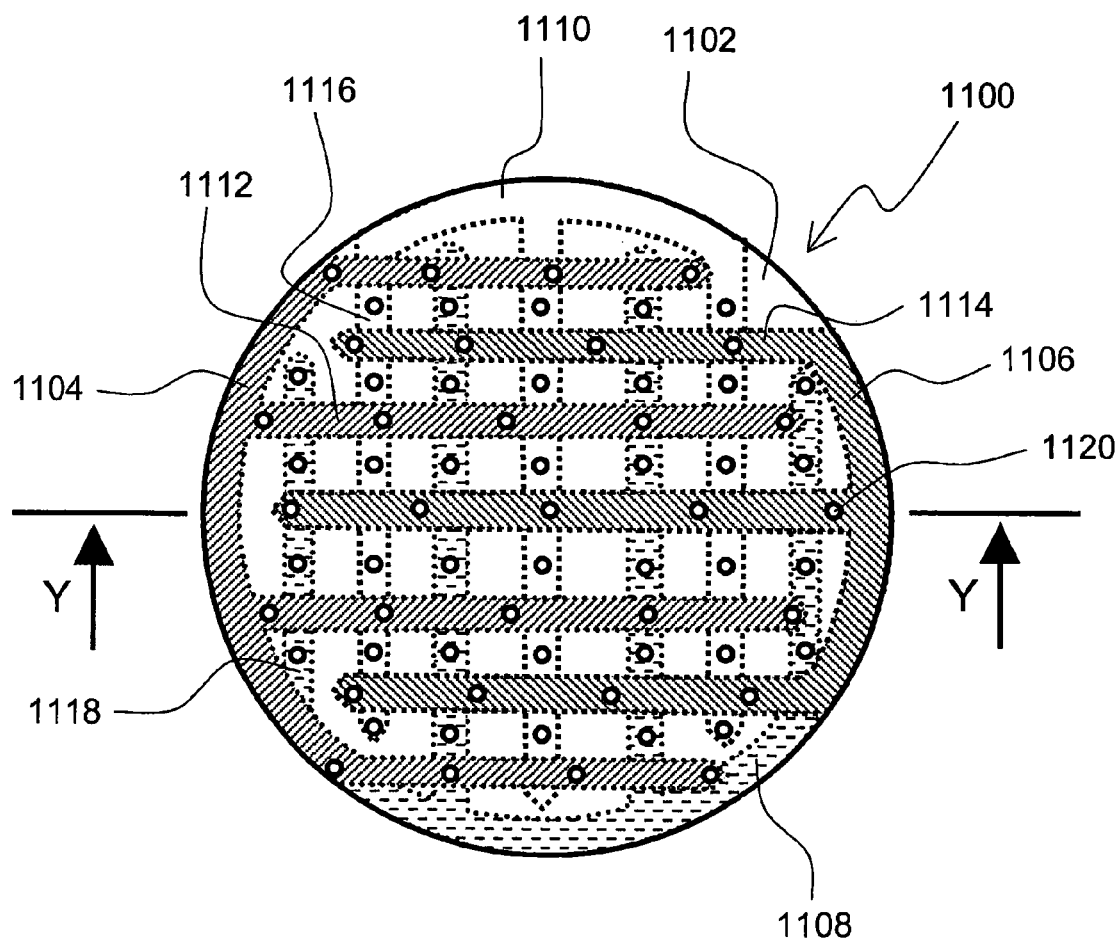
FIG. 11a is a schematic drawing of a flow distributor insert.

FIG. 11a depicts a schematic view of a flow distributor insert 1100. According to an embodiment of the invention the flow distributor insert substantially fills the expansion volume 802 so that each precursor flow is guided through corresponding flow rakes. The present embodiment may be implemented with or without the flow restrictor 810. The flow rakes are physically separated from each other. Each of the four flow rakes consists of a lateral spreader 1104, 1106, 1108, 1110, and a number of straight flow channels 1112, 1114, 1116, 1118, so that one end of each channel is in fluid communication with the corresponding lateral spreader and the rest of each channel is in fluid communication with the reaction space through a plurality of apertures 1120. The opposite flow rakes have interspersed flow channels so that two flow rakes can be placed to the same level within the flow distributor insert 1100. The flow distributor insert has such a thickness that the rakes can be machined at two height levels, so that the rake levels are on top of each other. In this embodiment there are altogether four rakes machined to a single flow distributor insert 1100.

Figure 11B:
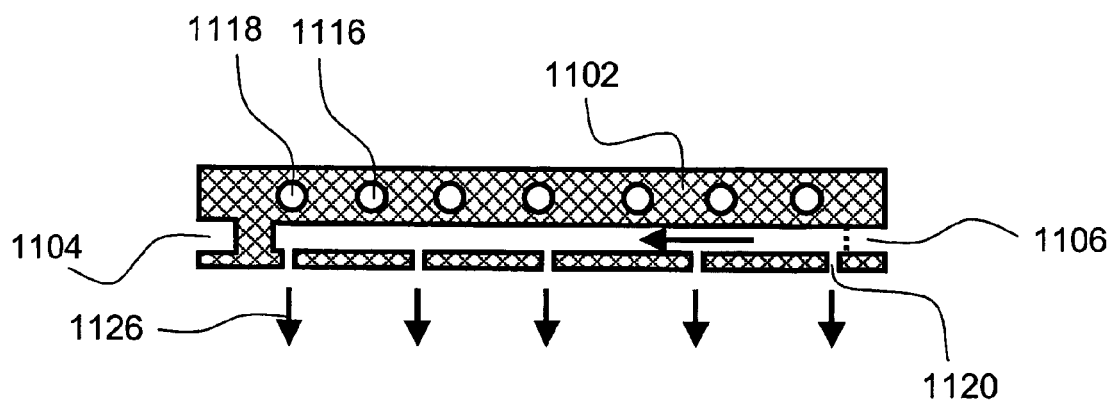
FIG. 11b is a schematic drawing depicting a side view of the flow distributor insert.

FIG. 11b depicts a schematic view of a cross section of the flow distributor insert 1100 along the Y-Y line as shown in FIG. 11a. The lateral spreader 1106 (and 1104, respectively) has a machined flow channel in the side edge from which the gas is guided through the flow rake(s) and the apertures 1120 towards the substrate(s) as indicated by the arrows 1126.

Figure 12:
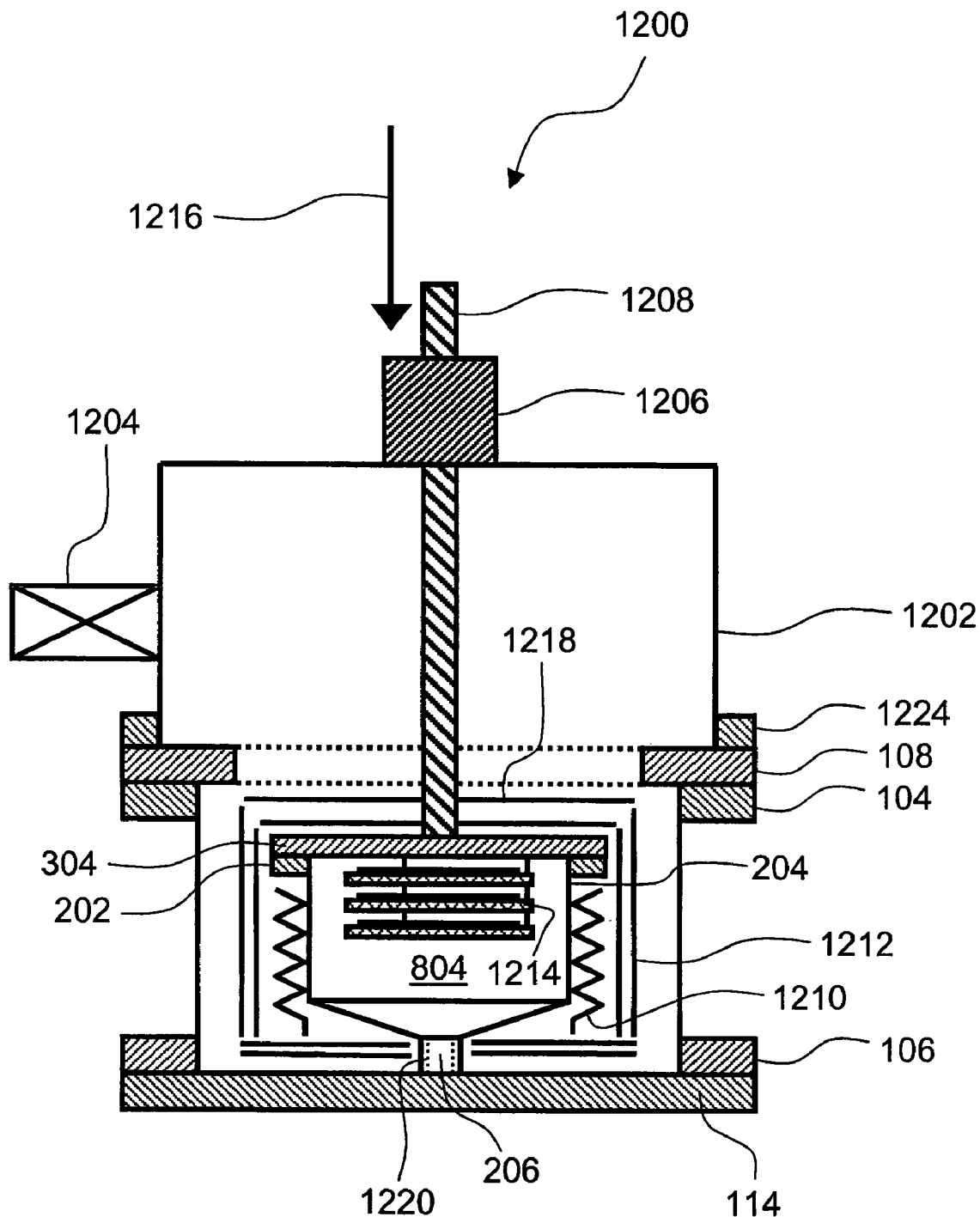
FIG. 12 is a schematic drawing depicting a side view of an ALD reactor equipped with a load lock, the movable dual lid being in a deposition position.

FIG. 12 depicts a schematic view of a single-lid minibatch ALD reactor 1200 equipped with a load lock chamber 1202 and a gate valve 1204. The reaction space 804 of the ALD reactor houses a minibatch system with multiple substrate holders (susceptors) 1214. A heating means, for example a resistive heating element 1210, is attached to the wall of the reaction chamber body 204 or to the close proximity of the wall and heat reflectors 1212 are located around the reaction chamber. The exhaust guide 206 extends downwards from the reaction chamber body 204 and rests on the lower interface flange 114. A gate valve 1204 and a lifting mechanism, such as an indexing mechanism 1206, have been attached to the load lock chamber 1202. The indexing mechanism 1206 controls the position of the movable single lid comprising a lifting rod 1208, top heat reflectors 1218, reaction chamber lid 304 and the multiple substrate holders 1214. When the indexing mechanism moves the lifting rod 1208 downwards, as indicated with the arrow 1216, the reaction space 804 is sealed from the top side with the reaction chamber lid 304. A load lock chamber flange 1224 is bolted to the upper interface flange 108 and to the top flange 104, and their interfaces are appropriately sealed.

The heating element(s) 1210 may be implemented, e.g. by a desired number of heating resistors. These heating resistors are placed in close proximity to the wall(s) of the reaction chamber body 204. However, it may be desirable for the heating resistors not to touch the wall(s) in order to avoid establishing hot points in the wall(s). Heat is transferred to inside the reaction chamber by radiation. The heat reflectors 1212 and 1218 form a "thermos bottle structure" which reduces the thermal leaks. Therefore smaller heat resistors are needed for the same heating effect compared to many prior-art solutions, resulting in power savings. In one embodiment, the heating reflectors are made from multilayer sheet metal.

In an embodiment a back streaming particle block 1220 comprising a porous cylinder is placed to the exhaust guide 206. One benefit of the said block 1220 is that solid particles that try to back stream from the exhaust line towards the reaction space are nailed down on the block 1220 surface because a thin film is growing and covering everything on the block surface during a deposition. Another benefit of the back streaming particle block 1220 is that it breaks the back diffusion path of gas molecules in the stagnant gas layer near the inner surface of the exhaust guide 206.

Figure 13:
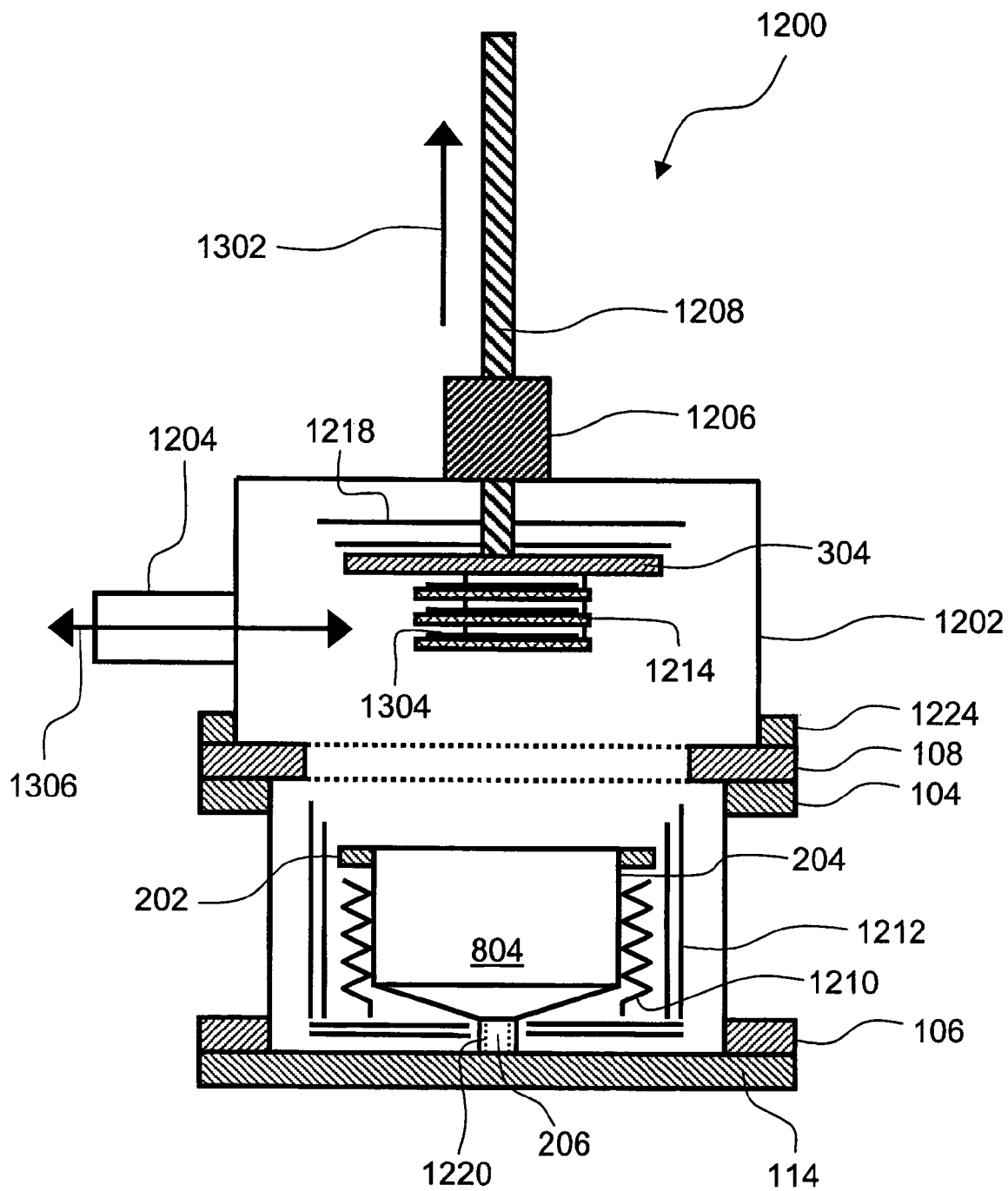
FIG. 13 is a schematic drawing depicting a side view of an ALD reactor equipped with a load lock, the movable dual lid being in a substrate access position.

FIG. 13 depicts a schematic view of a minibatch ALD reactor 1200 during the replacement of the substrates. The minibatch is lifted upwards with the indexing mechanism 1206, as indicated with the arrow 1302, until the substrate holders 1214 of the minibatch are within the reach of a wand (not shown) that moves horizontally as illustrated by arrow 1306 through the gate valve 1204. Depending on the implementation, the wand brings in one or more substrates at a time when the minibatch is loaded with new substrates and removes one or more coated substrates 1304 at a time from the minibatch after the deposition process has ended.

Figure 14:
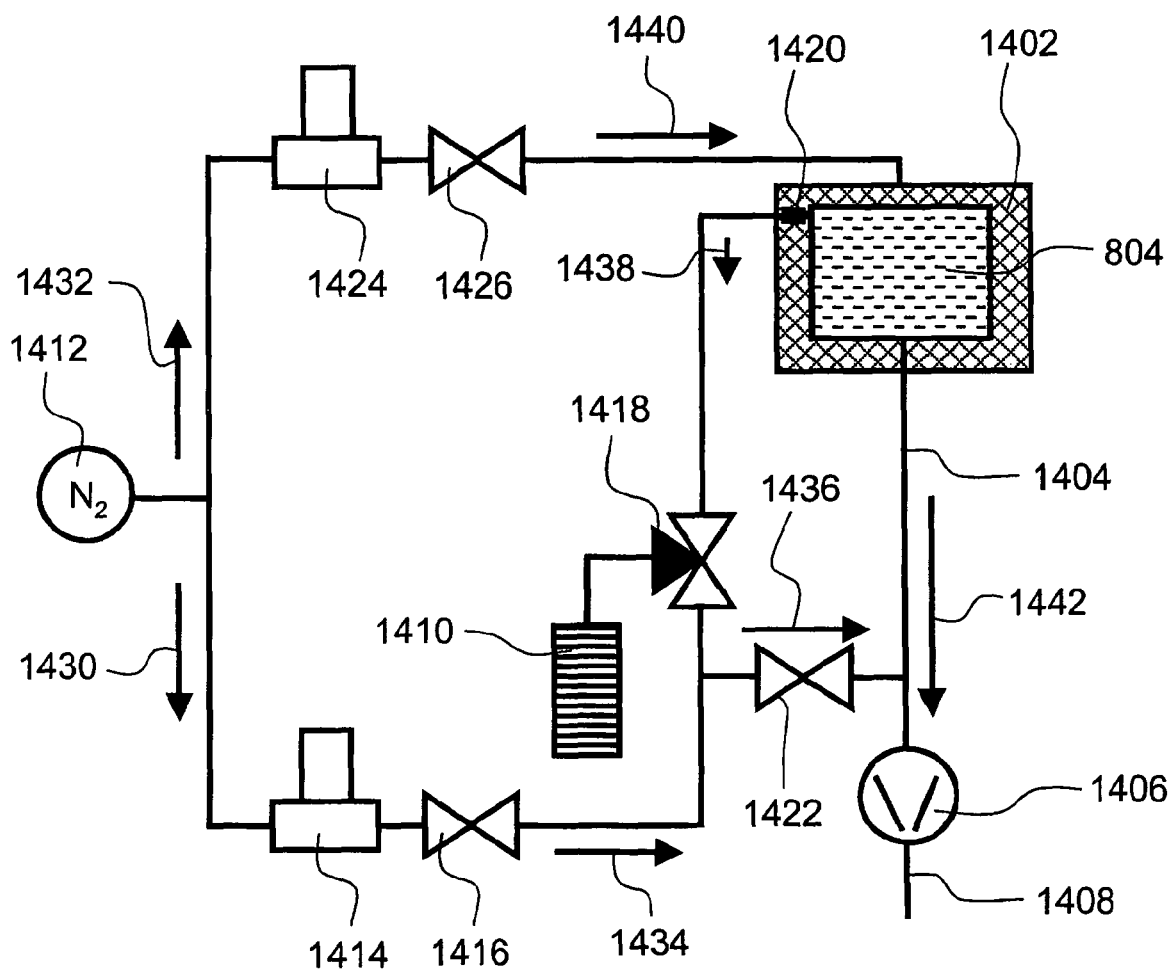
FIG. 14 is a schematic drawing of gas flows of an ALD reactor during a gas removal period.

FIG. 14 depicts process instrumentation related to an ALD reactor and gas flows during a removal period. For the sake of clarity, only one precursor source 1410 is shown although at least two precursor sources are needed for depositing a thin film by the ALD method. The precursor source 1410 is in fluid communication with a reaction space 804 through a computer-controlled three-way valve 1418 (hereinafter referred to as a precursor source control valve 1418). An inactive gas (e.g. nitrogen or argon) source 1412 provides carrier and removal gas to the ALD reactor. The inactive gas flow is divided into a carrier gas flow, as indicated with the arrow 1430, and an intermediate space (the intermediate space is referred to by reference number 1402) gas flow, as indicated with the arrow 1432. The flow of the carrier gas is controlled with a first mass flow controller 1414 and a first shut-off valve 1416. Similarly, the flow of the intermediate space gas is controlled with a second mass flow controller 1424 and a second shut-off valve 1426. The source line is equipped with a by-pass arrangement, e.g., a by-pass valve 1422 (hereinafter referred to as a drain control valve 1422) that is connected to the exhaust conduit 1404. The reaction chamber 804 is in fluid communication with a vacuum source 1406. The vacuum source 1406, e.g. a vacuum pump or a venturi, is further connected to an outlet 1408 for expelling compressed process gases.

The precursor source control valve 1418 is kept closed during the removal period. The drain control valve 1422 is kept open during the removal period. In an embodiment, a gas diffusion barrier unit 1420 (disclosed in T. Suntola's latter article mentioned in the background of the invention) is utilized. In this embodiment, the inactive gas flow (barrier flow) separated for example from the screen gas flow (not shown) and directed to the gas diffusion barrier unit 1420 is kept so strong that a gas diffusion barrier is formed within the gas diffusion barrier unit 1420 and the residual precursor molecules cannot flow into the reaction space 804 during the removal period. The barrier flow is divided within the gas diffusion barrier unit 1420 into two parts. The first part of the flow goes towards the reaction space and the second part of the flow goes towards the drain control valve 1422 as indicated with the arrow 1438. The second part of the flow pushes residual precursor molecules through the drain control valve 1422, as indicated with the arrow 1436, to the exhaust line 1404 and further as indicated with the arrow 1442 towards the vacuum source 1406. In another embodiment, a gas diffusion barrier unit is omitted. In this embodiment, the drain control valve 1422 is used after the exposure period for draining at least 50%, preferably about 80-90% of the inactive gas flow 1434 directly to the exhaust conduit 1404, so that only a minor part, e.g. less than 50%, preferably about 10-20%, of the inactive gas flow is going to the reaction space 804. The method of draining most of the inactive gas directly to the exhaust conduit 1404 actually helps to spread reactive gas within the reaction space 804, because small inactive gas flows cannot prevent the spreading of relatively strong reactive gas flow (from the other precursor source) within the reaction space 804.

Figure 15:
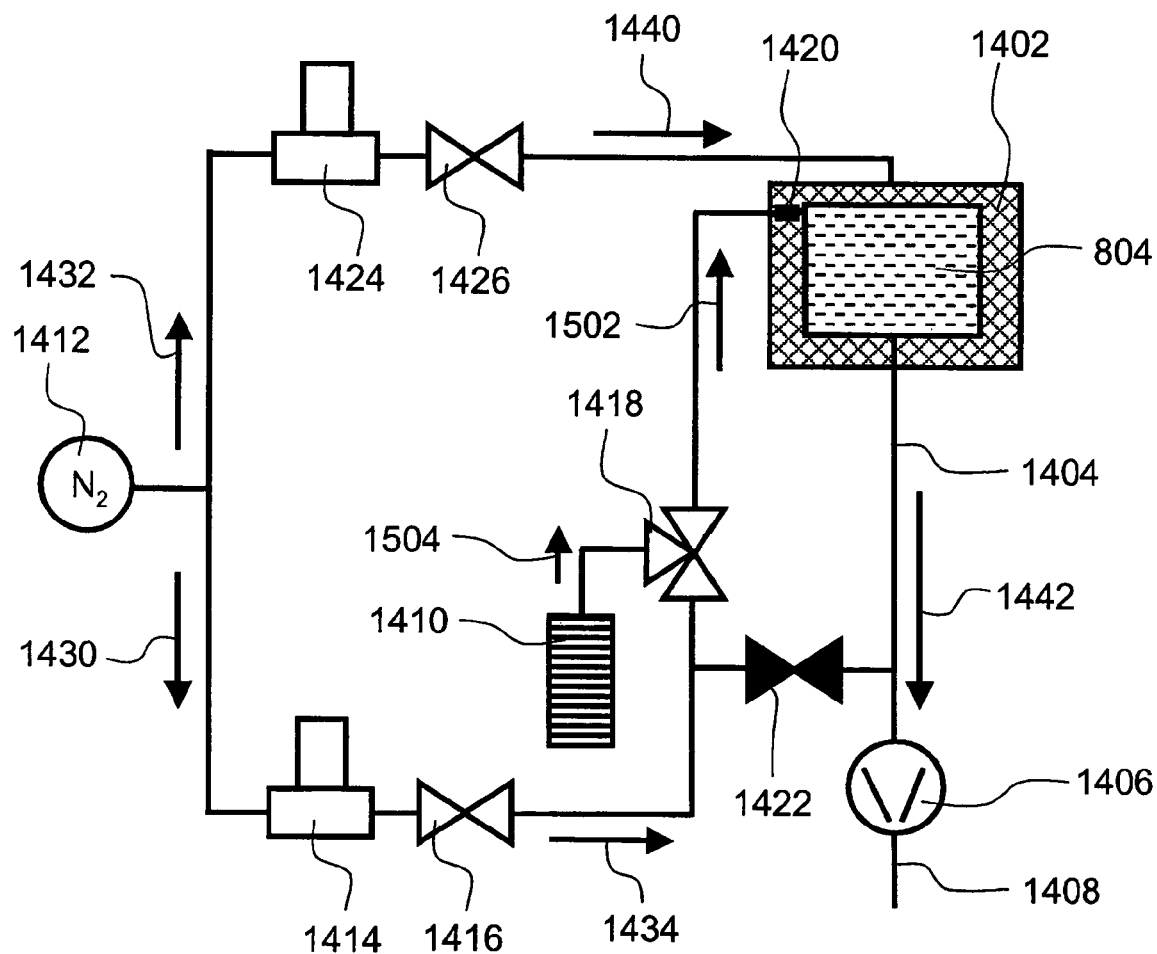
FIG. 15 is a schematic drawing of gas flows of an ALD reactor during an exposure period.

FIG. 15 depicts process instrumentation related to an ALD reactor and gas flows during a precursor exposure period. Precursor vapor is injected from the precursor source 1410 as indicated with an arrow 1504 through the precursor source control valve 1418 into the carrier gas stream that is arriving to the precursor source control valve 1418 as indicated with an arrow 1434. The resulting inactive gas-precursor vapor mixture flows only towards the reaction space as indicated with the arrow 1502 because the drain control valve 1422 is closed. In case the gas diffusion barrier unit 1420 is utilized, the inactive gas flow separated for example from the screen gas flow (not shown) and directed to the gas diffusion barrier unit 1420 is kept so weak that a gas diffusion barrier is not formed within the gas diffusion barrier unit 1420 and the precursor molecules can easily flow into the reaction space 804 during the precursor exposure period.

Figure 16:
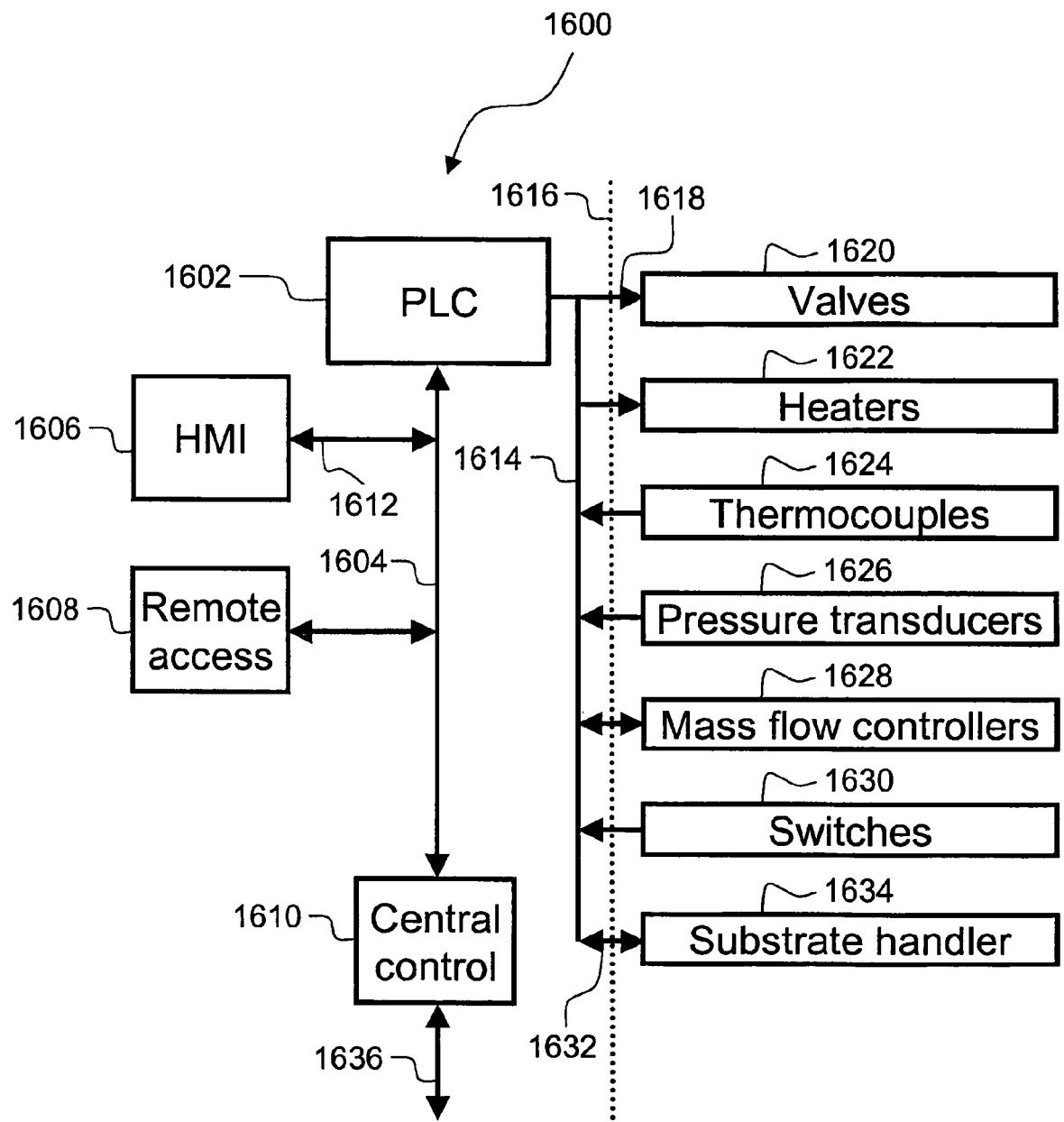
FIG. 16 is a block diagram of a control system for an ALD reactor.

FIG. 16 depicts a rough block diagram of an ALD reactor control system 1600. In a basic system setup process parameters are programmed with the aid of software and instructions are executed with a human machine interface (HMI) terminal 1606 and downloaded via Ethernet bus 1604 to a general purpose programmable logic control (PLC) unit of a control box 1602. The control box 1602 comprises at least one microprocessor for executing control box software comprising program code stored in a memory, dynamic and static random access memory, I/O modules, A/D and D/A converters and power relays. The control box 1602 sends electrical power, as indicated with an arrow 1618, to pneumatic controllers of the valves 1620 and heaters 1622 of the ALD reactor, reads output values of thermocouples 1624, pressure transducers 1626 and switches 1630 (e.g. an overheating switch) and has a two-way communication, as indicated with an arrow 1632, with mass flow controllers 1628 and a substrate handler 1634. The control box 1602 measures and relays probe readings from the ALD reactor to the HMI terminal 1606. A dotted line 1616 indicates an interface line between the ALD reactor parts and the control box 1602.

In an embodiment programs of the HMI terminal 1606 and the PLC unit within the control box 1602 are updated from a secured remote access point 1608 via the Ethernet bus 1604. The secured remote access point is placed anywhere on Earth within the reach of internet or a modem and is connected to the Ethernet bus 1604 with an interface card (not shown). In this embodiment the ALD reactor is supervised from a central control space 1610 for example via the Ethernet bus 1604. More than one ALD reactor can be connected via Ethernet buses 1604, 1636 to the central control space 1610. For example, an advanced ALD deposition system comprises one ALD reactor for the deposition of metal oxides, another ALD reactor for the deposition of metals or metal nitrides and a wafer handler for loading substrates, transporting the substrates between the ALD reactors and unloading the substrates. These ALD reactors and wafer handlers are connected to the central control space so that an integration of the ALD processes, e.g. to an automated wafer processing line is possible.

The present ALD reactor equipped with suitable gaseous, liquid and/or heated solid precursor sources can be used, for example, for the deposition of binary metal oxides, such as group IIIB oxides comprising scandium oxide $Sc_2O_3$, yttrium oxide $Y_2O_3$, lanthanum oxide $La_2O_3$ and lanthanide oxides, e.g. gadolinium oxide $Gd_2O_3$, group IVB oxides comprising titanium dioxide $TiO_2$, zirconium dioxide $ZrO_2$ and hafnium dioxide $HfO_2$, group VB oxides comprising tantalum pentoxide $Ta_2O_5$, group VIB oxides comprising tungsten trioxide $WO_3$, group VIIB oxides comprising manganese (III) oxide $Mn_2O_3$, group 8 oxides comprising ruthenium dioxide $RuO_2$, group IB oxides comprising copper (II) oxide $CuO$, group IIB oxides comprising zinc oxide $ZnO$, group IIIA oxides comprising aluminum oxide $Al_2O_3$, group IVA oxides comprising silicon dioxide $SiO_2$ and tin dioxide $SnO_2$, and group VA oxides comprising bismuth oxide $Bi_2O_3$, ternary and quaternary metal oxides of said groups, such as metal aluminates and metal silicates, solid solutions of metal oxides and metal oxide nanolaminates of said groups, such as $Al_2O_3/HfO_2$, metal nitrides, such as group IIIB nitrides comprising lanthanum nitride LaN, group IVB nitrides comprising titanium nitride TiN, group VB nitrides comprising niobium nitride NbN and tantalum nitride $Ta_3N_5$, group VI nitrides comprising molybdenum nitride MoN, group IIIA nitrides comprising aluminum nitride AlN, group IVA nitrides comprising silicon nitride $Si_3N_4$, and other metal compounds comprising tungsten nitride carbide $WN_xC_y$.

The substrate temperature of the present ALD reactor can be selected from a range of approximately 50-550° C. It is to be noted that this range is only a typical range at the moment; in the future higher temperatures may be appropriate. The reaction chamber pressure of the ALD reactor is usually in the range of approximately 1-5 hPa during a deposition process, although lower or higher process pressures are possible in other embodiments. A single substrate holder placed to the reaction chamber of the ALD reactor is suitable for up to 300 mm wafers. However, even larger substrates can be handled in other embodiments. A minibatch substrate holder placed to the reaction chamber of the reactor can typically hold 1-5 pieces of wafers. In case a powder cartridge is placed to the reaction chamber of the ALD reactor for coating the powder, it can hold, e.g., 2 dm³ of solid powder or less.

Embodiments of the present invention provide considerable benefits. The whole reaction space together with a heater and heat reflectors can be constructed inside a standard full nipple. The reaction space can be accessed from the top side of the reactor because the substrate holder, reaction space lid and, in certain embodiments, also the vacuum chamber lid are attached together and can be moved together up and down in vertical direction. Precursor gases can be fed from several precursor sources with a considerably short flow path length to the reaction space. Flow distributor insert on top side of the reaction space can be economically manufactured and used in production. Each substrate in a minibatch system receives a uniform dosage of precursor vapor because of the local gas in-feed points. There are only small thermal leaks between the reaction chamber walls and the vacuum chamber walls making it possible to utilize a low power heater for heating the reaction chamber. The reaction space is in direct thermal contact with the vacuum chamber body substantially only at the outlet conduit pipe that supports the reaction space. Another benefit is that the outer walls of the vacuum chamber do not require any liquid cooling system, or any special cooling arrangement, and they can be cooled with air due to low power dissipation of the reactor.

EXAMPLES

The following examples clarify the deposition process of selected materials:

Example 1

Deposition of a Binary Thin Film on a Single Substrate

Trimethyl aluminum $(CH_3)_3Al$, referred to as TMA hereinafter, and water were used as precursors for the deposition of $Al_2O_3$ thin film on heated surfaces within the reaction space of the SUNALE™ R-150 ALD reactor manufactured by Picosun Oy, Finland. TMA is liquid at room temperature and it has a vapor pressure of 13 hPa at 22° C., wherein 1 hPa=100 Pa=1 mbar. TMA can be injected from a temperature-controlled high-pressure liquid source. The source temperature for TMA was 20° C. Water is liquid at room temperature and it has a vapor pressure of 23 hPa at 20° C., which means that it can also be injected from a temperature-controlled high pressure liquid source. The source temperature for $H_2O$ was 20° C.

In this example a 150-mm silicon wafer with microelectromechanical structures (MEMS) on the wafer surface serves as a substrate. The dual-lid system was raised with a lifting mechanism to the upper position for accessing the substrate holder. The substrate was placed to the substrate holder and the dual-lid system was lowered with the lifting mechanism to the lower position. The dual lid sealed the ALD reactor from the room air in such a way that the reaction chamber lid sealed the reaction space and the vacuum chamber lid sealed the vacuum chamber. The secondary and primary pumping valves were opened one after another and the reaction space and the intermediate space were pumped down to below 1 hPa absolute pressure with a mechanical vacuum pump. While the vacuum pump was running the pressure of the reaction space was adjusted with flowing nitrogen gas to a pressure range of approximately 2-5 hPa. The pressure of the intermediate space was about 3-5 hPa higher than the pressure of the reaction space, so that precursor vapor could not leak from the reaction space to the intermediate space. In other embodiments different kind of pressure ranges are feasible, as long as gases can be removed quickly enough from the reaction space to the exhaust line and reactive gases cannot leak towards the intermediate space. The reaction chamber had been preheated to 300° C. in order to speed up the heating of the substrate. After the pressure had stabilized within the reaction space, the process control waited for about 5 minutes until the temperatures within the reaction space had become even.

The deposition cycle consisted of four basic sequential steps: $H_2O$ vapor exposure period (0.2 s), a first removal period (2.0 s), TMA vapor exposure period (0.2 s) and a second removal period (4.0 s). Although in this example the deposition was started with the non-metal precursor, it is possible in other embodiments to modify the deposition cycle so that the deposition starts with the metal precursor exposure. When the last deposition cycle ends with a metal precursor exposure, in some embodiments it is advantageous to add one non-metal exposure to the end of the deposition sequence so that the surface becomes passive towards the moisture of the room air. This time the total deposition cycle time was 6.4 s and it was obtained without utilizing any gas diffusion barrier in the in-feed conduit. In other embodiments the removal periods can be lowered down to 0.5-1.0 s when a gas diffusion barrier is operational within the in-feed conduit.

When the process control unit had completed the deposition sequence consisting of 200 identical deposition cycles, the pumping valves were closed and the reactor was vented with pure nitrogen gas to atmospheric pressure. The dual lid together with the substrate holder was raised to the upper position and the substrate was unloaded from the substrate holder for measurements. As a result of the deposition experiment, an $Al_2O_3$ thin film with a thickness of 18 nm was obtained on the substrate. It meant that the growth rate of $Al_2O_3$ was 0.09 nm/cycle at 300° C. Non-uniformity of the thin film thickness was only 0.5%. The thin film contained only <1 at.-% C and <1 at.-% H as impurities.

Example 2

Deposition of a Ternary Metal Oxide on a Minibatch

Tetrakis(trimethylsiloxy)titanium $[(CH_3)_3SiO]_4Ti$, referred to as TTMST hereinafter, was used as the titanium and silicon precursor. TTMST is liquid at room temperature and it has a vapor pressure of 13 hPa at 110° C., which means that it can be injected from a Heated Precursor Delivery System (HPDS). Water $H_2O$ and $O_3$ were used as oxygen precursors. Water was injected from a temperature-controlled high pressure liquid source. Ozone is gas at room temperature and it was injected as ozone-oxygen gas mixture from a gas source.

The TTMST source was heated to a temperature selected from a temperature range of about 100-130° C. In this deposition example the TTMST source temperature was 120° C. The water source temperature was controlled with a peltier element cooler so that the temperature of the water source was preferably slightly below the room temperature, although temperatures above the room temperature can be used in other embodiments. The water source was cooled to a temperature selected from a temperature range of about 5-20° C. In this deposition example the water source temperature was 18° C. Ozone was generated with an external ozone generator (SEMOZON® AX8560, manufactured by MKS, USA) from grade 6 oxygen gas that had preferably been doped with about 50 ppm of grade 5 nitrogen according to the guidelines of the manufacturer of the generator.

A minibatch substrate holder was provided with substrates 1304 (FIG. 13) through a gate valve 1204 (FIG. 13). The substrate holder was lowered to the deposition position (FIG. 12) so that the reaction chamber lid 304 (FIG. 12) closed the reaction space 804 (FIG. 12). The reaction space had been preheated to the deposition temperature of titanium silicate $Ti_xSi_yO_z$, which was selected from a temperature range of about 200-400° C., preferably about 250-300° C. In this example the substrate temperature was kept at 270° C. Usually it took approximately 1-4 minutes before the substrate was heated to the programmed deposition temperature within the reaction space.

The thin film was deposited from sequential exposure periods of TTMST, $H_2O$ and $O_3$ so that the precursor exposure periods were separated from each other by the gas removal periods. TTMST chemisorbed on the hydroxyl groups of the substrate surface until the hydroxyl groups had been consumed. The chemisorption process was thus self saturating. Although not willing to be bound to any theories it is assumed that during the chemisorption of the TTMST to the surface OH groups one trimethylsiloxy ligand detached from the TTMST molecule and the resulting precursor molecule fragment created a chemical bond to the oxygen atom of the OH group and formed a volatile by-product molecule according to Eq. 1.

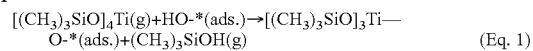
(Eq. 1)

Here, the asterisk "*" denotes a substrate surface and "ads." means chemisorbed. Residual TTMST molecules were guided from the reaction space to the exhaust line during the first removal period. Then the surfaces were exposed to $H_2O$ molecules. They reacted with the $[(CH_3)_3SiO]_3Ti$—O-* terminated surface so that OH-terminated $TiO_2$ surface possibly with Ti—O—Ti oxygen bridges (—O—) was formed and volatile hexamethyldisiloxane by-product molecules were liberated according to Eq. 2.

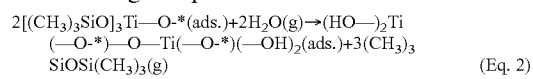
(Eq. 2)

After the second removal period the —OH terminated surface was again exposed TTMST molecules so that $[(CH_3)_3SiO]_3Ti$—O-* terminated surface was created. After the third removal period the $[(CH_3)_3SiO]_3Ti$—O-* terminated surface was exposed to $O_3$ molecules. Ozone molecules burned the alkylsiloxy ligands attached to the titanium atoms so that silicon and titanium formed solid non-volatile $SiO_2$ and $TiO_2$ oxides or $SiO_2$-rich titanium silicate on the surface and volatile by-product molecules, such as carbon dioxide and water, were liberated from the surface according to Eq. 3.

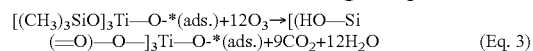
(Eq. 3)

The surface became terminated with the —OH groups. Finally, residual $O_3$ and reaction by-product molecules were guided to the exhaust line during the fourth removal period.

It can be understood from Eq. 3 that quite a lot of silicon dioxide $SiO_2$ is obtained on the surface during the surface reactions because the Si:Ti ratio is 3:1 in the chemisorbed molecule. Because two different kinds of oxygen precursors, viz. $H_2O$ and $O_3$, are available in the process, the Si:Ti ratio can be tailored in a wide range. Use of $H_2O$ produces $TiO_2$ and use of $O_3$ produces $SiO_2$-rich titanium silicate on the surface. The deposition cycle consisting of precursor exposure periods and gas removal periods was repeated until a titanium silicate $Ti_xSi_yO_z$ thin film of desired composition and thickness was obtained. A person skilled in the art will readily understood that use of other alkylsiloxymetal precursors than the Ti precursor of this specific example makes it possible to grow many other metal silicates or metal oxides by ALD.

After the deposition sequence had been completed the minibatch was raised to the upper position (FIG. 11) where the coated substrates were unloaded from the substrate holders and new substrates could be loaded to the substrate holders of the minibatch.

Example 3

Deposition of a Multilayer Thin Film on Solid Particles

Rhenium is a very expensive element and it is advantageous to minimize the consumption of Re compounds in processes. On the other hand, the surface of the substrate is not always optimal for the growth of metals without a pretreatment. The flexibility of the present ALD reactor makes it possible to have an ALD reactor with four precursor sources, so that the pretreatment and the actual coating can be done with a single pump down in one reactor.

TMA was used as an aluminum precursor. TMA was injected from a temperature-controlled high-pressure liquid source. Water was used as the oxygen precursor and it was also injected from a temperature-controlled high-pressure liquid source. Rhenium trioxychloride $ReO_3Cl$ was used as the rhenium source chemical. $ReO_3Cl$ is liquid at room temperature and it has a vapour pressure of 1013 hPa at 131° C. It was injected from a heated high pressure liquid precursor source. A person skilled in the art will readily understand that rhenium has several volatile oxyhalides that can be applied to the process instead of $ReO_3Cl$. Regarding the physical and chemical properties of rhenium oxyhalides, a reference is made to the book written by N. N. Greenwood and A. Earnshaw (Chemistry of the Elements, $1^{st}$ edition, Chapter 24, Pergamon Press 1986). Source temperatures used for TMA, $H_2O$ and $ReO_3Cl$ precursors in this deposition example were 18° C., 18° C. and 60° C., respectively. Ammonia $NH_3$ gas was used as the reducing agent and it was injected from an external gas source kept near room temperature.

The reaction space lid was raised and a cartridge loaded with silica ($SiO_2$) was placed to the reaction chamber of the ALD reactor. In this deposition example silica powder acted as a substrate. In other embodiments silica is replaced with other suitable solid powders or a three-dimensional part such as a fuel cell electrode. The dual lid was lowered to close the reaction space and the vacuum chamber. The vacuum chamber was evacuated and the pressure of the reaction space was adjusted to about 2-5 hPa with the vacuum pump and flowing nitrogen gas. The reaction chamber had been preheated to the deposition temperature, in this case to 300° C. The powder cartridge was let to reach the equilibrium temperature, which took typically about 10-20 minutes.

The silica particles were first coated with aluminum oxide $Al_2O_3$ according to Eq. 4 to create a uniform surface density of reactive —OH groups. This kind of pretreatment helped to reduce the incubation time of metal film growth. The process cycle consisted of four steps: TMA exposure period, a first removal period, $H_2O$ exposure period and a second removal period. The process cycle was repeated about 20 times to initiate the growth of $Al_2O_3$ and form a uniform $Al_2O_3$ thin film on the silica particle surfaces.

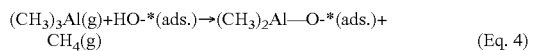 (Eq. 4)

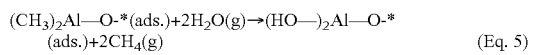 (Eq. 5)

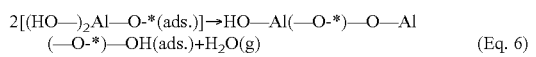 (Eq. 6)

Next, $Al_2O_3$-coated silica particles were coated with a thin film that consisted of rhenium Re metal. The process cycle consisted of four steps: $ReO_3Cl$ exposure period, a third removal period, $NH_3$ exposure period and a fourth removal period. Without willing to be bound by any theory it is assumed that $ReO_3Cl$ molecules reacted with the OH surface groups according to Eq. 7. Further, it is assumed that activated $NH_3$ molecules reduced $ReO_3$ molecules into elemental Re according to Eq. 8. In any case, the result of the process was that the surface of the powder gradually became covered with a Re-rich thin film. Depending on the substrate temperature and the reducing agent the reduction process may also result in the formation of rhenium oxides that can be applied as catalytically active coatings.

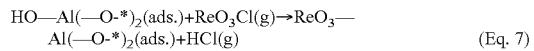 (Eq. 7)

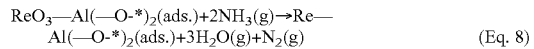 (Eq. 8)

The pulsing sequence was repeated about 2-50 times to initiate the growth of the metal film and add enough Re on the substrate surface. After the deposition had been completed, the pressure of the reaction space was increased with nitrogen gas to atmospheric pressure and the dual lid was raised so that the powder cartridge with the Re coated powder could be accessed. The resulting Re coated particles are used for example as catalysts for hydrogen gas processes. It is possible to recover surplus Re precursor from the exhaust line and recycle the expensive metal. The back streaming particle block 1220 placed to the exhaust guide near the reaction chamber has a lot of surface and it can conveniently be used for transforming gaseous Re compounds into non-volatile Re through chemical reactions.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combinations or sub combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

We claim:

1. An atomic layer deposition apparatus for the deposition of material on at least one substrate, wherein the atomic layer deposition apparatus comprises:
a dual-chamber system which comprises a reaction chamber inside a vacuum chamber that surrounds the reaction chamber, the reaction chamber providing a place in which the deposition of material is arranged to take place, the apparatus comprising a reaction chamber lid configured to form a lid to the reaction chamber and a vacuum chamber lid configured to form a lid to the vacuum chamber, a lifting mechanism for accessing the reaction chamber for loading or unloading the at least one substrate from the top side of the reaction chamber, and a substrate holder for receiving said at least one substrate and for holding the at least one substrate in the reaction chamber during deposition, and wherein said substrate holder is integratable or integrated with said reaction chamber lid, and wherein the atomic layer deposition apparatus is configured to grow material on the at least one substrate by sequential self-saturating surface reactions.

2. The atomic layer deposition apparatus of claim 1, wherein the reaction chamber is accessible from the top side of the reaction chamber and said substrate holder is movable in the atomic layer deposition apparatus together with said reaction chamber lid in a vertical direction.

3. The atomic layer deposition apparatus of claim 2, wherein said substrate holder is movable in the atomic layer deposition apparatus together with said reaction chamber lid into a substrate loading/unloading station.

4. The atomic layer deposition apparatus of claim 1, wherein the atomic layer deposition apparatus further comprises a vacuum chamber lid for forming a lid to the vacuum chamber, and wherein said vacuum chamber lid is integratable or integrated with said reaction chamber lid in order to form a dual-lid system.

5. The atomic layer deposition apparatus of claim 1, wherein the atomic layer deposition apparatus is intended for growing material or thin films on heated surfaces by sequential self-saturating surface reactions below the atmospheric pressure.

6. The atomic layer deposition apparatus of claim 1, wherein the reaction chamber lid and the substrate holder are made substantially from a single piece or as an assembly comprising more than one piece.

7. The atomic layer deposition apparatus of claim 1, wherein the reaction chamber lid comprises an expansion volume.

8. The atomic layer deposition apparatus of claim 7, wherein the reaction chamber lid further comprises a mesh or a perforated plate that extends substantially across the bottom side of the expansion volume and is attachable or attached to the bottom side of said reaction chamber lid.

9. The atomic layer deposition apparatus of claim 1, wherein the atomic layer deposition apparatus further comprises a heating means for heating the reaction chamber and a local heating means in the reaction chamber for heating the substrate holder, wherein said local heating means is separate from said substrate holder.

10. The atomic layer deposition apparatus of claim 1, wherein the atomic layer deposition apparatus comprises an inactive gas source and at least two precursor sources.

11. The atomic layer deposition apparatus of claim 1, wherein the atomic layer deposition apparatus is configured to perform a purge step with inactive gas in between two precursor exposure periods.

12. The atomic layer deposition apparatus of claim 1, wherein the atomic layer deposition apparatus comprises heat reflectors located around the reaction chamber so as to form a thermos bottle structure.

13. The atomic layer deposition apparatus of claim 12, wherein the atomic layer deposition apparatus comprises a heating element inside the thermos bottle structure.

14. The atomic layer deposition apparatus of claim 1, wherein the atomic layer deposition apparatus comprises the lifting mechanism for controlling the position of the reaction chamber lid.

15. The atomic layer deposition apparatus of claim 1, wherein the atomic layer deposition apparatus further comprises a heat reflector in connection with the reaction chamber lid configured to move together with the reaction chamber lid.

\* \* \* \* \*